(12) United States Patent
Nakanishi et al.

(10) Patent No.: US 6,257,772 B1
(45) Date of Patent: Jul. 10, 2001

(54) PHOTODIODE MODULE

(75) Inventors: Hiromi Nakanishi; Yoshiki Kuhara, both of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/398,148

(22) Filed: Sep. 17, 1999

(30) Foreign Application Priority Data

Sep. 18, 1998 (JP) .................................................. 10-283416
Sep. 29, 1998 (JP) .................................................. 10-274670

(51) Int. Cl.$^7$ ...................................................... G02B 6/36
(52) U.S. Cl. ............................... 385/89; 385/88; 257/432; 257/433
(58) Field of Search ................................. 385/88, 89, 90, 385/92; 257/431, 432, 433

(56) References Cited

U.S. PATENT DOCUMENTS

| 5,671,315 | 9/1997 | Tabuchi et al. . |
| 5,896,481 | 4/1999 | Hager et al. . |
| 6,141,471 | * 10/2000 | Agatsuma ............................ 385/88 |

FOREIGN PATENT DOCUMENTS

| 35 43 558 | 6/1987 | (DE) . |
| 63-22565 | 5/1988 | (JP) . |
| 9-054228 | 2/1997 | (JP) . |
| 9-54228 | 2/1997 | (JP) . |
| WO 96/22177 | 7/1996 | (WO) . |

OTHER PUBLICATIONS

B. Hillerich et al., "Self–aligned Flat–Pack Fibre–Photodiode Coupling," *Electronics Letters*, vol. 24, No. 15, Jul. 1988, p.918–919.
Patent Abstracts of Japan, vol. 1997, No. 06, Jun. 30, 1997 & JP 09 054228, Feb. 25, 1997.
Hillerich B., et al., "Self–Aligned Flat–Pack Fibre–Photodiode Coupling"Electronics Letters, GB, IEE Stevenage, vol. 24, No. 15, Jul. 21, 1998.

* cited by examiner

*Primary Examiner*—Hung Xuan Dang
(74) *Attorney, Agent, or Firm*—Smith, Gambrell & Russell

(57) ABSTRACT

A PD module including a planar substrate, a first V-groove formed in the longitudinal direction on the substrate, a path-changing groove formed in the lateral direction vertically to the first V-groove on the substrate for ensuring a space at an extension of the first V-groove, an optical fiber fixed in the first V-groove for guiding signal light, a slanting reflection plane formed at the front wall of the path-changing groove for reflecting the light emanating from the fiber, a PD chip with a width B and a length C mounted on three spots of the substrate over the path-changing groove, the PD lying above the path-changing groove and the slanting reflection plane, a transparent adhesive with a refractive index similar to the fiber being supplied to a space including the end of the fiber, the path-changing groove and the bottom of the PD chip, and a fixation adhesive supplied on the first V-groove and on the transparent adhesive for fixing the fiber to the first V-groove, the light emanating from the fiber being reflected by the slanting reflecting plane and being introduced into the PD chips.

30 Claims, 27 Drawing Sheets

Fig.18
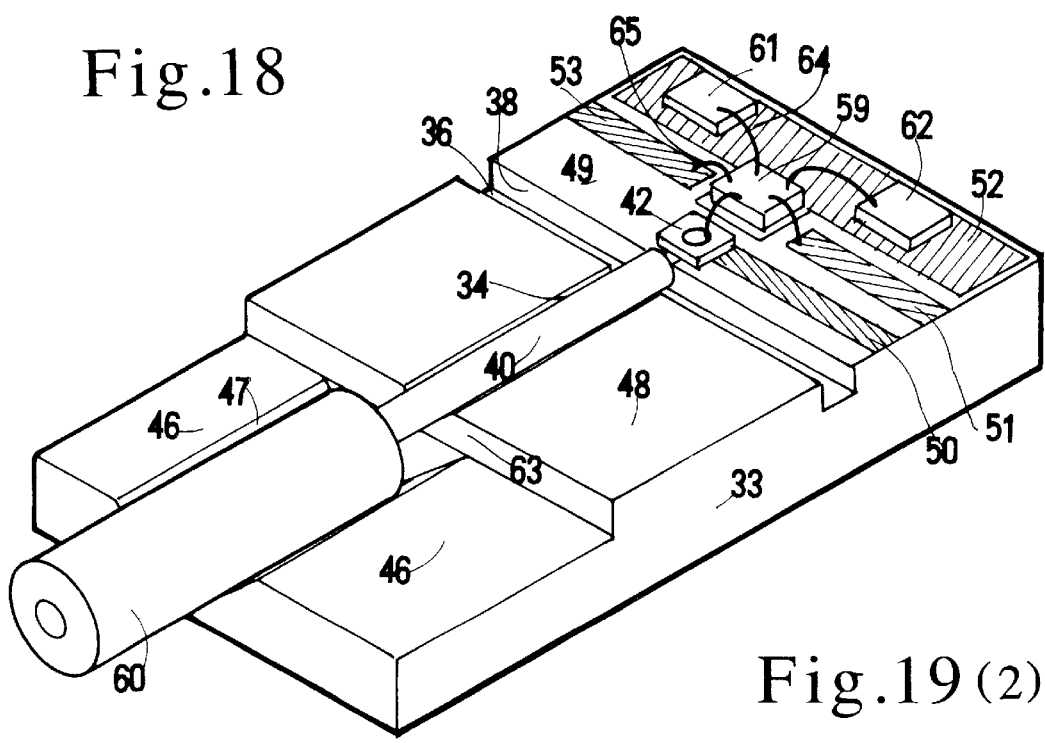
Fig.19 (2)
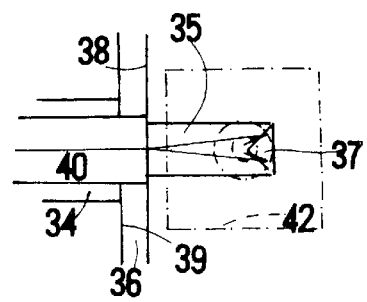
Fig.19 (1)
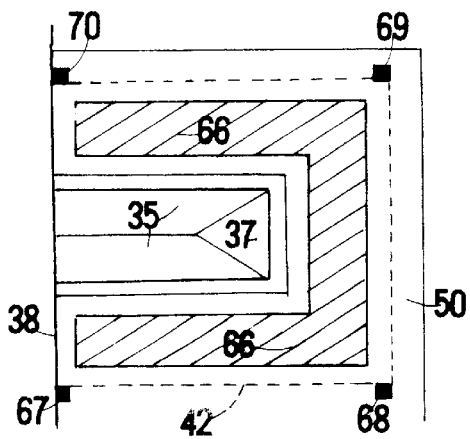
Fig.19 (4)
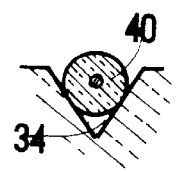
Fig.19 (3)
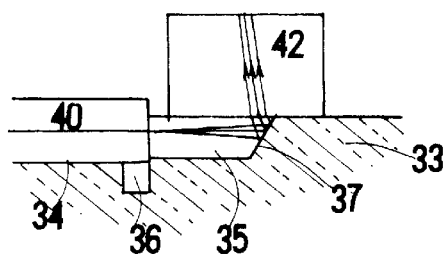
Fig.19 (5)

Fig.47
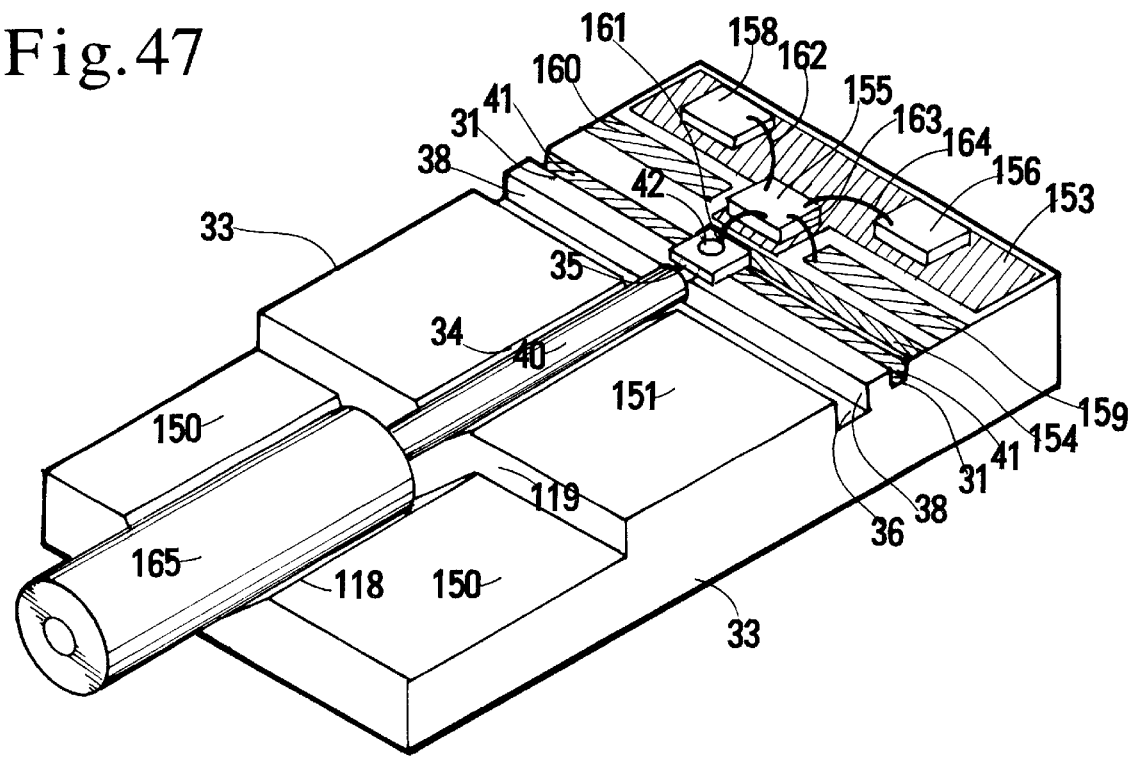
Fig.48 (1)
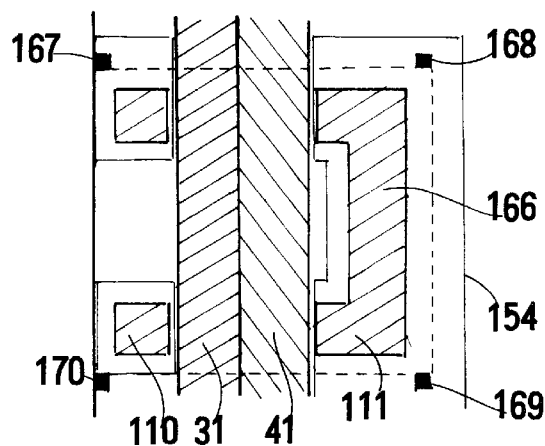
Fig.48 (2)
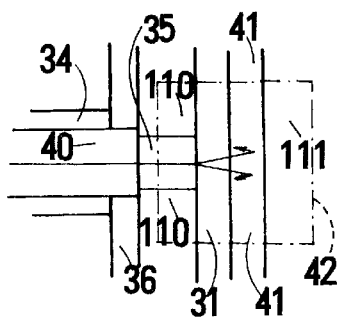
Fig.48 (4)
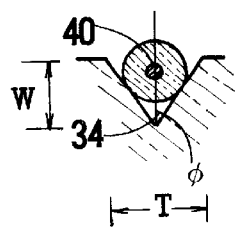
Fig.48 (5)
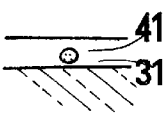
Fig.48 (3)
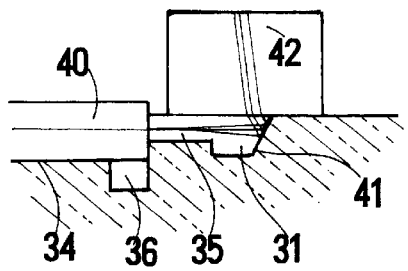

Fig.53
Fig.52
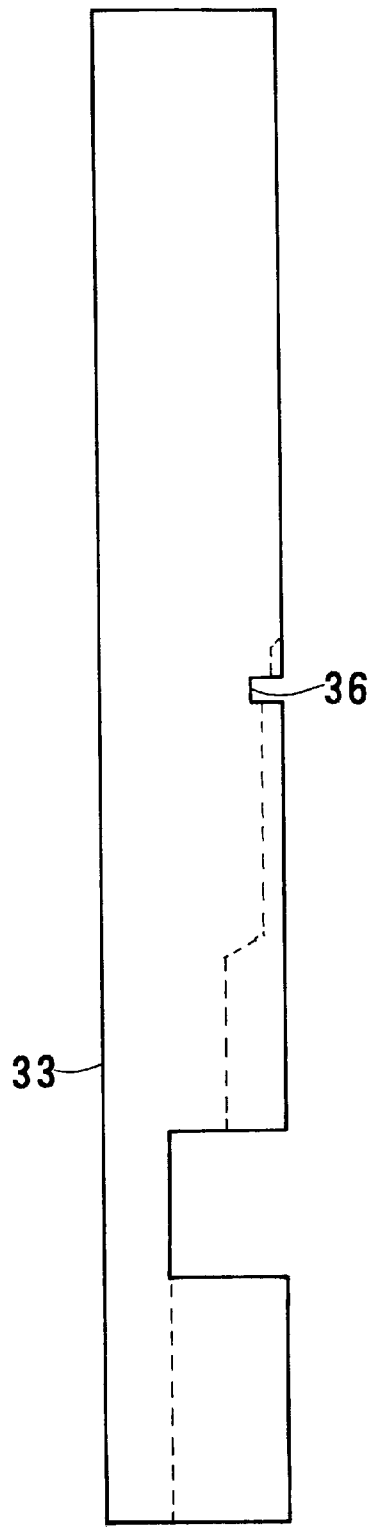
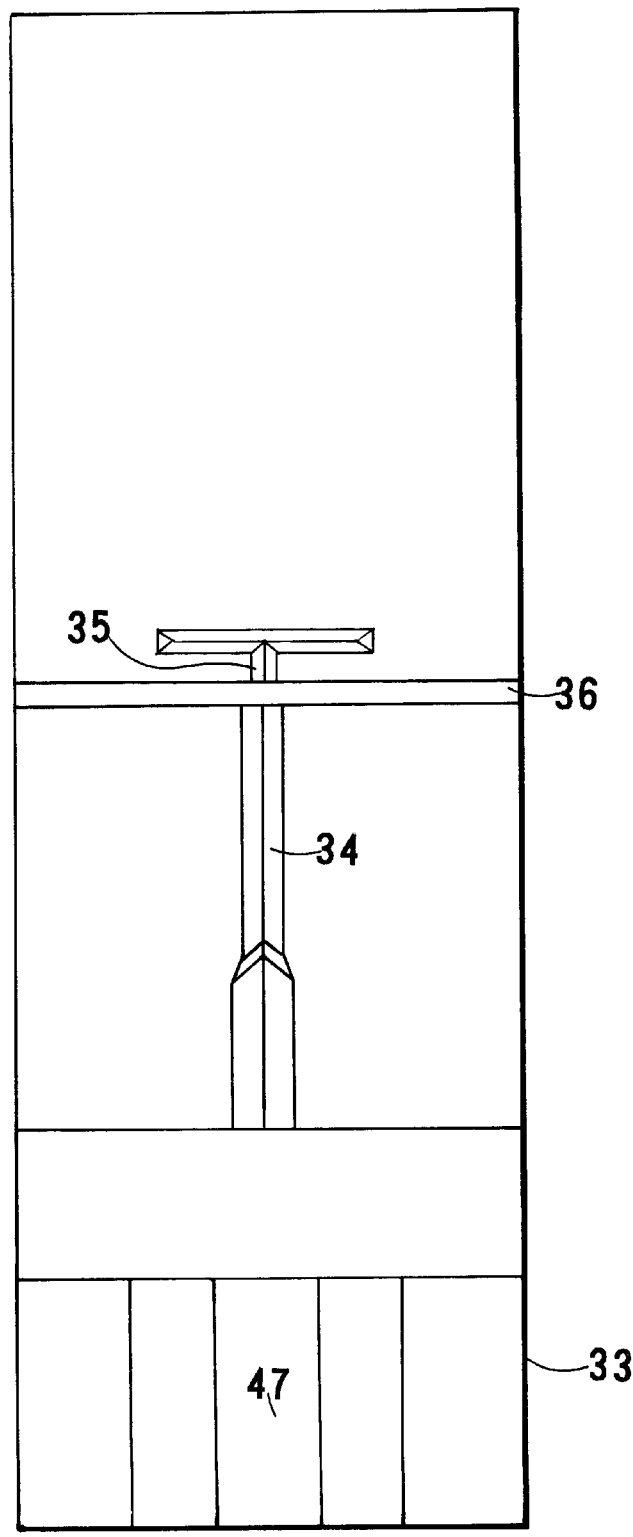

PHOTODIODE MODULE

BACKGROUND OF THE INVENTION

1. Field of the Invention

This invention relates to a planar type photodiode (PD) module as a receiving device for optical communication. The meaning of the planar type is explained. Prior PD modules have a three dimensional structure mounting a PD chip on a round stem, sustaining a lens above the PD chip by a cylindrical holder standing on the stem, supporting a fiber just above the lens and the PD chip by a cylindrical sleeve standing on the stem. The lens converges rays from the fiber into the top surface of the PD chip. The rays propagate in free space from the fiber to the PD in the package. Here, lines of individual partial light are called rays. An assembly of rays is called a beam. The beam axis is vertical to the PD chip and the stem. Since the end of the fiber is distanced from the PD, the rays disperse in the free space. Thus, the lens is required for converging the rays onto the PD. The prior PD module is a cylinder having pins at the bottom and a fiber at the top. Such a cylindrical device is not suitable for handling. Mounting on a print circuit board requires soldering the pins to holes of the print circuit board and inclining the cylinder into a horizontal posture by bending the pins at right angles. When a plurality of print circuit boards are piled in a vertical direction, it is determined that the pitch between the neighboring boards should be shorter than 9 mm. The pitch is a sum of the thickness of the board and the distance between the neighboring boards. Prior tall cylindrical PD modules cannot satisfy the requirement.

The planar type module is a contradictory to the prior bulky, tall modules. The planar type signifies the device having the optical fiber being parallel with and fixed to the substrate and dispensing with a lens. Since the optical fiber lies on the substrate and the beam axis is parallel to the surface, the device is called planar type. Since the fiber is stuck to the substrate, the planar type device requires a cylindrical package no more. The planar type device can make use of a flat package by laying the fiber, the PD and so forth on a flat substrate and molding the whole by a resin. The short distance between the fiber and the PD can afford to eliminate the lens.

The omission of the lens allows the device to exclude the optical adjustment among the fiber, the lens and the PD. Elimination of the lens lowers the parts cost and the assembly cost. Low, flat packages are convenient for mounting the planar type device on a print circuit board. Suppressing the cost of the optical devices ardently requires planar type devices.

In general, an end of an optical fiber faces directly to an LD, an LED or a PD without a lens in the planar type optical devices. Elimination of the lens requires more rigid tolerances for mounting. Some contrivances are suggested for exact mounting of PDs, LEDs or LDs in the planar type devices. None of the proposals have been prevailing owing to the drawbacks.

This application claims the priority of Japanese Patent Applications No. 10-283416 (283416/1998) filed on Sep. 18, 1998 and No.10-274670 (274670/1998) filed on Sep. 29, 1998, which are incorporated herein by reference.

2. Description of Prior Art

A typical planar type PD module has a Si substrate having a structure for fixing a PD chip and an end of an optical fiber at a determined position. Anisotropic etching of Si forms a V-groove on the Si substrate for adapting a fiber. The PD module guides the light going out of the fiber to the PD chip by reflecting the light by a mirror made in the V-groove. Anisotropy of etching signifies that the etching rate on {100} planes are far faster than the etching rate of {111} planes for special etchants in a silicon single crystal. Some etchants reveal such anisotropic etching speeds for Si. The anisotropy allows the etchant to make holes enclosed by {111} planes.

The anisotropic etching makes a V-groove having a (1-11) plane and (11-1) plane by painting a (100) Si single crystal substrate with a resist, removing a resist in a stripe extending along [011], making a striped window in the direction and etching the Si substrate by the etchant which has a faster {100} plane etching rate than a {111} plane etching rate. Fortunately, a (111) plane appears at the end of the V-groove. The angles held between the surface (100) and the V-groove side walls (1-11) and (11-1) are 126 degrees. The bottom angle of the V-groove is 71 degrees. The angles between the V-groove walls (1-11) and (11-1) and the end wall (111) are 108 degrees. The angle between the end wall (111) and the surface (100) is not 135 degrees but 126 degrees.

Direction indexes and plane indexes have been defined in crystallography as follows. Individual direction is denoted by square bracketed numerals [ . . . ] Collective direction is denoted by edged bracketed numerals< . . . >. Individual plane is designated by round bracketed numerals ( . . . ). Collective plane is designated by wavy bracketed numerals { . . . }. The above explanation is directed to a [011] striped V-groove. A [0±1±1] striped V-groove can also be made in a similar way. The Si substrate has a good conductivity, which is inconvenient as a base. The Si substrate is preparatively coated with a $SiO_2$ film of a 0.5 $\mu$m to 3 $\mu$m thickness which is made by oxidization of the Si or sputtering $SiO_2$. Thus, the Si substrate consists of a bulk Si single crystal and a thin $SiO_2$ insulating film. The Si substrate is a $SiO_2$/Si substrate in a rigorous meaning. But it is simply called a Si substrate in brief hereafter.

An optical fiber is adapted into the V-groove on the Si substrate for producing the planar type PD module. The rays emitted from the fiber are reflected upward by the (111) mirror plane at the end of the V-groove. The rays enter the PD from the bottom. The V-groove, the end mirror and the PD above the mirror build up a planar PD module which dispenses with a lens.

The planar PD module has a fundamental structure explained above. Improvements have been proposed for the planar type PD modules in addition to the fundamental structure. Three of the proposals are described here. None of them have been brought into practice yet owing to difficulties.

[Prior Art 1: PD Riding on the Fiber End (FIG. 1 to FIG. 4)]
① German Patent Publication DE 35 43 558 C2 (Inventors: Hillerich Bernd, Rode Manfred, Filing date, Dec. 10, 1985)
② B. Hillerich & A. Geyer, "SELF-ALIGNED FLAT-PACK FIBER-PHOTODIODE COUPLING", Electronics Lett., vol.24, No. 15, 1988, p918–919

These documents reported a method of making a V-groove on a Si plate by anisotropic etching, placing a PD at an end of the V-groove, inserting an end of a fiber beneath the PD into the V-groove and fixing the fiber with an adhesive having a refractive index similar to the fiber. These proposals have a feature of placing the fiber end into a small hole formed by the V-groove and the PD chip. The novel structure is explained by FIG. 1 to FIG. 4. FIG. 1 is a section of the PD module structure. FIG. 2 is a plan view of a part of the V-groove made on a Si platform (substrate). FIG. 3 is a plan view of the V-groove sustaining an end of a fiber. FIG. 4 is a plan view of the Si substrate having the V-groove with the fiber end covered with a PD chip.

A V-groove 2 is made by coating a (100) Si single crystal substrate 1 with a resist, opening a [011] directing striped window by mask-based exposure and development, and etching the masked Si substrate by anisotropic etchant, which can reveal a (1-11) plane and a (11-1) plane on the Si by the difference of the etching rates. In addition to side walls of (11-1) plane and (1-11) plane, a (111) plane is formed at an end of the V-groove 2. The (111) plane is assigned to a slanting mirror surface 4. A PD chip 5 is mounted above an end of a fiber 3 upon the (100) surface. An electrode is connected to a printed pattern by a wire. The end of the fiber 3 is inserted into the hole beneath the PD 5 on the V-groove 2 on the Si substrate 1 till the fiber end comes into contact with the slanting mirror surface 4. The fiber 3 is stuck into the V-groove 2 by an adhesive 7.

The V-groove 2 must be deep enough for allowing the end of the fiber to submerge completely in the V-groove. W denotes the depth of the V-groove 2. $\phi$ is half of the bottom angle. D is the diameter of the fiber. The depth W should satisfy an inequality $$W > D(1 + \csc \phi)/2. \tag{1}$$

The bottom angle is 71 degrees for the V-groove made by the anisotropic etching. Then, W>D(1+cosec35°)/2=1.35D. For example, the depth W is deeper than 169 $\mu$m for a fiber with a 125 $\mu$m diameter. If the V-groove is defined by perfect {111} planes, the depth W and the width B have a simple relation $$B = 2W \tan \phi = 2W \tan 35° = 1.45W. \tag{2}$$

For the fiber of 125 $\mu$m diameter, the width B should be bigger than 245 $\mu$m.

The traversing and vertical alignments of the fiber are automatically done by the V-groove 2. The axial alignment is done by the slanting mirror plane 4 with which the fiber end collides. Namely, the V-groove of the Si substrate saves the alignment of the fiber. The fiber dispenses with alignment. This is an advantage. Only the PD needs facile alignment. The distance between the fiber end and the PD chip is too short to disperse the rays from the fiber. The PD chip is stably fixed on a bisecting portion of the Si platform. The structure is simple. These are also advantages.

However, the newly proposed type of the PD module has two drawbacks. One drawback is invisibility of the end of the fiber, since the end submerges into the narrow hole below the PD chip 5. The PD 5 conceals the end of the fiber. No body can examine by eyesight whether the end is actually in contact with the slanting mirror (111) surface and whether the adhesive fills the small hole. The other drawback is the difficulty of the adhesive 7 invading and filling the small space. After the fiber has been inserted into the small space, the adhesive is supplied into the small gaps between the fiber and the groove walls. Viscous adhesive is reluctant to invade into the restricted space. For example, if W=1.35D, the sectional area of the hole enclosed by the V-groove and the PD is about 1.7 times larger than the section of the fiber. But the extra section of the hole is only 0.7 time of the fiber section, since the fiber end is inserted into the hole. The narrowness prevents the adhesive from filling of the space. If the penetration of the adhesive is incomplete, a void 8 occurs in the space as shown in FIG. 1.

The adhesive has another role of reducing the reflection of light at the end of the fiber by the refractive index nearly equal to the fiber. If the void 8 remains in the adhesive, the interface would scatter light strongly by the discontinuity of the refractive indices. The smaller refractive index of the void 8 is apt to disperse the rays. The reflection loss on the bottom of the PD increases. The existence of bubbles raises the loss by scattering or reflecting. Incomplete filling of the small space with the adhesive causes such problems.

But the PD covering the fiber end prevents an inspector from examining whether the adhesive fills the hole.

[Prior Art 2: Two-substrate Coupling Structure (FIG. 5 and FIG. 6)]

Japanese Patent Publication No.63-22565 suggested an improved PD module having two substrates for supporting PDs and fibers instead of a single substrate. FIG. 5 is a perspective view of a substrate having ends of fibers and FIG. 6 is a perspective view of another substrate having PD chips. A first Si substrate 11 has longitudinal V-grooves 12 and 13 which are made in the [011] direction by anisotropic etching on a (100) Si single crystal substrate and a lateral groove 14 which is also made by the same anisotropic etching simultaneously. The bottom of the lateral groove 14 is deeper than the bottoms of the longitudinal grooves 12 and 13. Though the grooves 12,13 and 14 are simultaneously dug by the anisotropic etching, the lateral groove 14 has still a flat (100) bottom due to the shortage of the etching time. The slanting planes of the groove 14 are (111) planes. The farther slanting plane is a reflecting plane 15. The first part of FIG. 5 is produced by inserting fibers 16 and 17 into the longitudinal V-grooves 12 and 13 with the fiber ends being in contact to the reflecting plane 15 and fixing the fibers with an adhesive to the first substrate 11. Beams emitted from the fibers 16 and 17 are converted into upward beams 23 and 24 by the reflecting plane 15.

Since the groove 14 extends in the lateral direction, the first substrate 11 has no room for supporting PD chips. Sustaining the PDs requires a second substrate 18 with an L-shaped section. The second substrate 18 has two square holes. PD chips 19 and 20 having an n-electrode and a p-electrode on an upper surface have been prepared. The PD chips 19 and 20 are buried in the holes. The electrodes on the PDs are connected by wirebonding to metal patterns printed on the substrate 18. The PD module is assembled by turning upside down the second substrate 18, posing the second substrate 18 on the first substrate 11 with a front side 22 of the second substrate 18 being in contact to an end wall 21 of the first substrate 11 and sticking the second substrate 18 to the first substrate 11. The beams 23 and 24 emitted from the fibers 16 and 17 are introduced into the PDs 19 and 20.

Sinking the fibers into the V-grooves requires the depth W of the longitudinal V-groove to satisfy an inequality;

$$W > (D/2)(\csc \phi + 1), \tag{3}$$

where W is the depth of the V-grooves, D is the diameter of the fibers and $\phi$ is half a bottom angle of the V-grooves. The lateral groove is deeper than W.

This module need not insert the fiber beneath the PD unlike the former module of FIG. 1 to FIG. 4. The PD device has an advantage of allowing a worker to observe the ends of the fibers for assembling the modules. Another advantages are facile axial alignment of the fibers by the slanting wall 15 and easy adhesion of the fibers. The adhesive fills also the lateral groove 14. The existence of the extra groove 14 eliminates the occurrence of a void in the adhesive. The groove 14 solves the problems of the irregularity of the adhesive and the light scattering by the void. In addition, the module is suitable for installing a plurality of fibers and PDs. These are strong points of the PD module.

But, the proposed PD module has also drawbacks. The lateral groove 14 forbids the module to support PDs by three points of the same substrate unlike the former module of FIG. 1 to FIG. 4. Cantilevering PD chips on the rear bank of the substrate 11 would be prohibited owing to the instability. Since the first substrate 11 with the fibers cannot carry the PD chips, the second substrate 18 is indispensable for installing the PDs. Coupling the two substrates requires rigorous alignments between the substrates in two dimensions. The upside-down mounting adds a difficulty to the alignment. Misalignment between the substrates would be induced also by mismatching of the PDs on the first substrate18 and misplacing the lateral groove 14 on the substrate 11. The preceding mismatches would spoil the following effort for aligning two substrates at the optimum positions.

Complexity is a more serious drawback of the module. The PD module having a substrate carrying the PDs coupled to another substrate having the fibers cannot be called a planar type PD module any more. The high cost would make the proposed PD module impractical.

[Prior Art 3; double-stepped V-groove PD module (FIG. 7 to FIG. 9)]

A PD module with a double-stepped V-groove was proposed by Japanese Patent Laying Open No.9-54228. FIG. 7 to FIG. 9 show the PD module. FIG. 7 is a vertical section of a main part having a V-groove. FIG. 8 is a plan view. FIG. 9 is a section of the V-groove.

A (100) Si single crystal substrate 25 is prepared. Anisotropic etching with a mask produces a first larger V-groove 26 and a second smaller V-groove 27 following the first groove 26 at a stretch. Both the grooves have a common central line, extending in the [011] direction. The walls of the V-grooves 26 and 27 are (1-11) planes and (11-1) planes. The difference of the depth makes a slanting (111) plane 28 at the boundary. Another slanting (111) plane 29 is made at the end of the smaller groove 27. The fiber 30 is rested onto the first groove 26. The front end of the fiber touches the slanting plane 28. A PD chip 32 is -mounted on the substrate 25 just above the end of the second groove 27. The beam emitted from the fiber 30 is reflected by the slanting plane 29 and is guided into the PD chip 32 via the bottom surface.

In the case, a part of the fiber 30 projects above the substrate from the V-groove 26 unlike the former device of FIG. 1 to FIG. 4. The depth of the larger groove 26 should satisfy an inequality;

$$W<(D/2)(1+\operatorname{cosec} \phi)=D(1+\operatorname{cosec} 35°)/2=1.35D. \quad (4)$$

Here, $\phi$ is half a bottom angle of the V-groove. The anisotropic etching on a (100) Si substrate gives 71 degrees of a bottom angle. Then, $\phi$ is 35 degrees. For example, the depth W is shallower than 169 $\mu$m for the fiber diameter D=125 $\mu$m. Another inequality should hold due to the condition that the beam should propagate in the second shallower V-groove 27.

$$W>(D/2)\operatorname{cosec} \phi=(D/2)\operatorname{cosec} 35°=0.85D. \quad (5)$$

Namely, the depth of the first V-groove 26 should satisfy two inequalities, $$(D/2) \operatorname{cosec} \phi<W<(D/2)(1+\operatorname{cosec} \phi). \quad (6)$$

For $\phi=35°$, W should interpose between 0.85D and 1.35D. Since the front end of the fiber touches the slanting wall 28, the depth U of the second V-groove 27 should satisfy an inequality $$U<W-(D/2)(\operatorname{cosec} 35°-1)=W-0.35D. \quad (7)$$

Because the beam emitted from the fiber should pass through the second V-groove, the depth U of the second V-groove 27 should allow an inequality, $$U>W-(D/2)\operatorname{cosec} 35°=W-0.85D. \quad (8)$$

A general condition for U is expressed by $$W-(D/2)\operatorname{cosec} \phi<U<W-(D/2)(\operatorname{cosec} \phi-1). \quad (9)$$

In the concrete for $\phi=35°$, D should interpose between (W−0.85D) and (W−0.35D).

The PD module has an advantage that the front end of the fiber is not hidden by the PD. Since the end of the fiber is visible by eyesight, it is easy to fill the space below the PD in front of the fiber completely with a resin. The module can suppress the occurrence of the void which causes the scattering of light or random reflection. The double stepped grooves can also be carved by the simultaneous anisotropic etching.

Above-mentioned three prior PD modules have still drawbacks. Prior art 1 (fiber end hidden beneath the PD) inserts the end of the fiber into the narrow space beneath the PD chip. The resin cannot always fully fill the narrow space bellow the PD chip. If air bubbles remain in the resin, interfaces between air and the resin or the fiber and air reflect light. The bubbles along the light path would induce random scattering and reflection of light, which reduce the light power entering the PD chip. Another drawback is an invisible end of the fiber hidden by the PD chip which is pointed out by Japanese Patent Laying Open No.9-54228.

Prior Art 2 (two-substrate type) has drawbacks induced by the long lateral groove which forbids a single substrate to support both the fiber and the PD. The module requires two substrates. It is difficult to align the first substrate having the fibers exactly to the second substrate having the PDs. Instead of being a thin planar device, the PD module is bulky and large-sized. The complexity of the structure and the difficult alignment raise the production cost.

Prior Art 3 (double-stepped V-grooves) pays little attention to the kinds of adhesives. The adhesive fixes the fiber on the substrate. In addition to the first role, the adhesive has another role. The adhesive fills the intermediate space between the fiber and the PD. The adhesive should be transparent to the light. Transparency to the light is important for the adhesive. Besides the transparency, the adhesive is required to have a similar refractive index (n=1.46) to the fiber. Otherwise, random scattering or reflection would be induced by the difference of the refractive indexes.

The double-stepped V-groove module paints a transparent adhesive on the fiber and the V-grooves for fixing the fiber. But in general, transparent adhesives have weaker adhesion than opaque ones. When the adhesive once is dried up, the transparent adhesive is still so elastic that the fiber and the PD can move a little. A stronger adhesive should be adopted for fixing the fiber to the substrate everlastingly. Strong adhesives are generally an opaque resin which is forbidden to interpose between the fiber and the PD. The weak adhesion casts a shadow on the long-term reliability of the PD module.

SUMMARY OF THE INVENTION

One purpose of the present invention is to provide a planar type PD module that reinforces the fixation of a fiber and ensures the transparency of the light path by employing two kinds of adhesives. Another purpose of the present invention is to provide a planar type PD module which enables the two adhesives to separate spatially without mixing. A further purpose of the present invention is to provide an inexpensive resin-mold type PD module.

A first PD module of the present invention has a substrate, a first V-groove perforated on the substrate, a partition groove perforated on the substrate perpendicular to the first V-groove, the partition groove being deeper than the first V-groove, a second V-groove perforated on the substrate with a common axis with the first V-groove, the second V-groove being shallower than the first V-groove and facing the first V-groove via the partition groove, an upward slanting reflection plane formed at an end of the second V-groove, a PD chip mounted on the substrate above the end of the second V-groove, a fiber fixed in the first V-groove with a front end being in contact with a front wall of the partition groove, a transparent adhesive covering the end of the fiber, the partition groove, the second groove and the PD chip, a fixing adhesive for fixing the fiber to the substrate, a resin mold package enclosing the substrate, the end of the fiber and the PD chip.

This invention forms three grooves on the substrate. The first groove is a longitudinal V-groove for fixing the end of the fiber. The second groove is a longitudinal V-groove for changing the light path including a reflection plane (mirror part). The third groove is a lateral partition groove which separates the second groove from the first groove. The partition groove is not a V-groove but a rectangular sectioned trench. This invention features the partition groove. The partition groove interposes between the first groove and the second groove. A role of the partition groove is exact alignment of the fiber on the substrate. Another role of the partition groove is suitable division of a transparent adhesive and another opaque fixation adhesive. The partition groove enables the transparent adhesive to fill the light path between the fiber end and the PD chip without occurrence of a void. Then, the second fixation adhesive is supplied on the first adhesive and the fiber in order to fix the fiber end to the groove. The formation of the three grooves ensures high accuracy of the alignment of the fiber and the PD on the substrate.

A second PD module of the present invention has a substrate, a V-groove perforated on the substrate, a path-changing groove perforated on the substrate perpendicular to the first V-groove, a slanting reflection plane which is one of the surfaces of the path-changing groove, a PD chip mounted on the substrate above the end of the path-changing groove, a fiber fixed in the V-groove, a transparent adhesive covering an end of the fiber, the path-changing groove and the PD chip, a fixing adhesive for fixing the fiber to the substrate, a resin mold package enclosing the substrate, the end of the fiber and the PD chip.

In the PD module, the light beam emitted from the end of the fiber is introduced into the path-changing groove, is reflected by the slanting reflection plane and is guided into the PD via the bottom surface. This device is a planar type PD module, since the fiber is fixed on a single substrate.

This invention forms the V-groove for mounting the fiber and the path-changing groove on the substrate and mounts the PD chip on the substrate above the path-changing groove. The path-changing groove is wider than the PD. The path-changing groove is significant. Extending in a direction vertical to the axial line, the path-changing groove plays a role of changing the light path upward and a role of guiding the adhesive to fill the space entirely beneath the PD chip. Namely, the path-changing groove enables the adhesive to occupy all the space between the fiber end and the PD chip without void. The path-changing groove is so wide that the pre-hardened adhesive can flow into the narrow space with enough fluidity.

In addition to the path-changing groove, the use of two kinds of adhesives is another feature of the invention. One is a transparent adhesive. The other is an opaque adhesive. The transparent adhesive should occupy the light path between the fiber and the PD. The opaque adhesive should fix the fiber to the V-groove. Soft silicone-type resin is suitable for the transparent adhesive. Softness of the transparent adhesive alleviates the stress acting to the fiber end and the PD chip. Thermal expansion or contraction of the transparent resin is so small that the spatial relation between the PD and the fiber is not brought out of order. The silicone-type soft resin can be half-hardened by ultraviolet light or heat. The hardening is not complete. The transparent adhesive keeps elasticity and absorbs the stress induced by the temperature change. Fortunately, the refractive index of the silicone-type resin is akin to that of the quartz fiber. The silicone resin plays a role of a matching oil for suppressing the reflection. The transparent resin shows little absorption for the infrared light of wavelengths between 1300 nm and 1600 nm. The prior art PD modules are used to paint the transparent resin overall on the substrate for the sake of transparency. It has been a common sense to employ the silicone-type elastic transparent resin for fixing the fiber and the PD to the substrate.

The current transparent resin is not sufficient for fixing tightly the fiber into the V-groove, since insufficient hardening of the transparent adhesive allows the fiber to deviate from the predetermined position in the V-groove. The elasticity which has been a merit for the transparent adhesive is now a drawback for the purpose of fixing the fiber on the substrate tightly. Then, this invention employs another adhesive which is excellent in hardening for fixing the fiber instead of the elastic, transparent adhesive. This adhesive is called a "fixation adhesive" for discriminating from the transparent adhesive. The role of the newly introduced fixation adhesive is only to fix the fiber to the V-groove. The fixation adhesive need not have transparency or a similar refractive index to the fiber. The refractive index is arbitrary for the fixation adhesive. Opaque resin is available for the fixation adhesive. Epoxy resin, for example, can be employed for the fixation adhesive.

The use of two adhesives is one of the features of the present invention. If two resins were supplied to the fiber, the PD and the groove at different timing without further contrivance, the fluidity would mix the two adhesives with each other and the opaque resin would shield the light path between the fiber and the PD. This invention prepares a contrivance for the problem of mixing of the two resins. The first PD module of the present invention has a lateral partition groove between two V-grooves for avoiding the mixture.

The partition groove has a function of positioning the front end of the fiber. In addition, the partition groove has another function of providing a definite space for potting (applying) the transparent adhesive. The partition groove of the present invention is different from the lateral groove of FIG. 5. The lateral groove of FIG. 5 inhibits the PD module from mounting a PD chip on the bank beyond the groove.

This invention further forms a second smaller V-groove following the partition groove for ensuring a U-shaped surface for mounting the PD chip. The second V-groove enables the PD chip to ride on the same substrate as the fiber and the present module dispenses with two-substrate structure of FIG. 5 and FIG. 6. Having the double grooves, another prior art of FIG. 7 to FIG. 9 has no partition groove. The lack of the partition groove would forbid the module to separate two resins spatially.

The second PD module of the present invention makes a wide path-changing groove beneath the PD chip for facilitating the transparent adhesive to fill the space completely without void by enhancing the fluidity. After the space has been fully filled with the first transparent adhesive without void and the adhesive has half-hardened in the space, the fixation adhesive is applied to the substrate for fixing the fiber to the V-groove. The supply of the fixation resin follows the half-hardening of the first resin. The time lag of the supply of the second resin prohibits the fixation resin from invading the light path between the fiber and the PD chip. The path-changing groove should have a large volume allowing the first transparent resin to flow over and fill up the space including the path-changing groove. The path-changing groove should have a larger length than the PD chip for ensuring a large volume. A groove of the full width of the substrate is also available for the path-changing groove. The lateral length of the path-changing groove should satisfy an inequality, $$B < L \leq H, \quad (10)$$

where L is the length of the path-changing groove, B is the width of the PD and H is the width of the substrate. The path-changing groove of the present invention is different from the lateral groove 14 in FIG. 5, which refuses the PD chip to ride on the substrate. The path-changing groove allows the present invention to mount the PD chip on a further bank and a nearer banks which are formed by the path-changing groove and the small V-groove. The PD chip is founded on the three banks. The breadth Q of the path-changing groove should be smaller than the length C of the PD. The lower limit of the breadth Q is determined by the height of the fiber core and the slanting angle Θ of the slanting reflection plane. The vertical distance between the fiber core and the substrate surface is equal to W−(D/2)cosec φ, where W is the depth of the V-groove, D is the diameter of the fiber and φ is a half bottom angle. The lower limit of Q is a product of the vertical distance by cot Θ. A range of the breadth of the path-changing groove is restricted by an inequality $$\{W-(D/2)\operatorname{cosec} \phi\}\cot \Theta < Q < C. \quad (11)$$

When the grooves are made on the substrate by machine tools, arbitrary angles can be allotted to φ and Θ). When the grooves are formed by silicon anisotropic etching on a (100) silicon wafer, φ=35 degrees and Θ=54 degrees. Besides, the smaller V-groove preceding the path-changing groove should be narrower than the PD. Thus, this invention can mount the PD and the fiber on the same single substrate. This invention can save one substrate in comparison with the prior device of FIG. 5 and FIG. 6.

The first type of the invention is a PD having a partition groove, a larger V-groove and a smaller V-groove. The smaller V-groove has a narrow slanting reflecting plane at the end. The partition groove helps a resin to pervade into the space beneath the PD by increasing the effective volume of grooves. The partition groove has another role of positioning the fiber at an exact spot. The PD is sustained by three bases which means the existence of three inlets for the resin into the space under the PD. The transparent adhesive suppresses the reflection and the scattering in the space between the fiber end and the PD, since the adhesive has nearly equal refractive index to the fiber core. Other common advantages will be explained later with regard to the second type of the invention for avoiding repetition.

The second type of the invention is a PD module having a path-changing groove and V-grooves. The path-changing groove has a wide slanting reflecting plane on a wall. The path-changing groove facilitates a resin to invade and occupy the space under the PD by enhancing the fluidity of the transparent resin. The transparent resin can fully fill the space between the fiber and the PD without void. The light path between the fiber and the PD is occupied by the transparent resin having a refractive index similar to the fiber. Neither reflection nor refraction occurs at the interface between the fiber and the resin. The resin prohibits random scattering and random reflection from occurring. In addition to the optical properties, the transparent adhesive improves the physical property. Since the transparent adhesive is processed by irradiating with ultraviolet light or by heating, the adhesive keeps elasticity to some extent, the elasticity protects the fiber end or the PD from external stress or thermal stress. The ferrule and the fiber are stuck to the substrate firmly by the fixation adhesive. If the partition groove is added to the module, two kinds of adhesive will be spatially divided by the partition groove. The compensating use of two type adhesive is one feature of the invention which has never been suggested by prior art.

The width Q of the path-changing groove is shorter than the length C of the PD. Bridging the path-changing groove, the PD can be in contact with the three bases separated by the V-groove and the path-changing groove. The inequality Q<C enables a single substrate to maintain the PD.

This invention proposes a PD module of a planar structure which can be stored on a printed board with a total height less than 9 mm. The small volume alleviates the cost and raises the utility. Such a narrow volume for storing is quite impossible to the prior cylindrical PD module hermetic-sealed in a metal package. In addition to the planar structure, a plastic mold package further lowers the cost of the PD modules.

This invention can be applied to a multi-PD module having a plurality of fibers and PDs. An increase of the number of PDs raises the effects of the path-changing groove for injecting the adhesive beneath the PD, the partition groove for enhancing fluidity of the adhesive, the V-groove for aligning the fiber, the transparent adhesive for suppressing the reflection or the scattering and the adoption of the inexpensive plastic package. These effects enable a PD module to reduce the cost of production and the cost of parts.

BRIEF DESCRIPTION OF THE DRAWINGS

FIG. 18 is an oblique view of the Si substrate equipped with a ferrule, the fiber end, the PD, an AMP and other devices.

FIG. 19(1) a plan view of the path-changing part having the smaller V-groove and the slanting reflecting plane of the same embodiment PD module as FIG. 18.

FIG. 19(2) a plan view of the fiber and the path-changing part having the smaller V-groove and the slanting reflecting plane which reflects the rays emitted from the fiber end upward.

FIG. 19(3) a longitudinal vertical section of the fiber and the path-changing part having the smaller V-groove and the slanting reflecting plane which reflects the rays emitted from the fiber upward to the PD chip.

FIG. 19(4) is a lateral vertical section of the bigger V-groove.

FIG. 19(5) is a lateral vertical section of the smaller V-groove.

FIG. 47 is an oblique view of the same Si substrate having longitudinal V-grooves, a lateral partition groove and a path-changing groove in accompanied by a fiber, a ferrule, a PD chip and wirings.

FIG. 48(1) is a plan view of the path-changing groove and the PD mounting base on the same substrate as FIG. 47.

FIG. 48(2) is a plan view of the path-changing groove and the fiber for showing the rays emitted from the fiber end.

FIG. 48(3) is a longitudinal vertical section of the path-changing part of the same embodiment as FIG. 47.

FIG. 48(4) is a lateral section of the ferrule and the V-groove.

FIG. 48(5) is a lateral section of the path-changing groove.

FIG. 52 is a plan view of a substrate of a further embodiment.

FIG. 53 is a longitudinal sectional view of the substrate of FIG. 52.

DESCRIPTION OF THE PREFERRED EMBODIMENTS

[Embodiment 1: V-groove+Partition Groove+Small V-groove]

Figure 10:
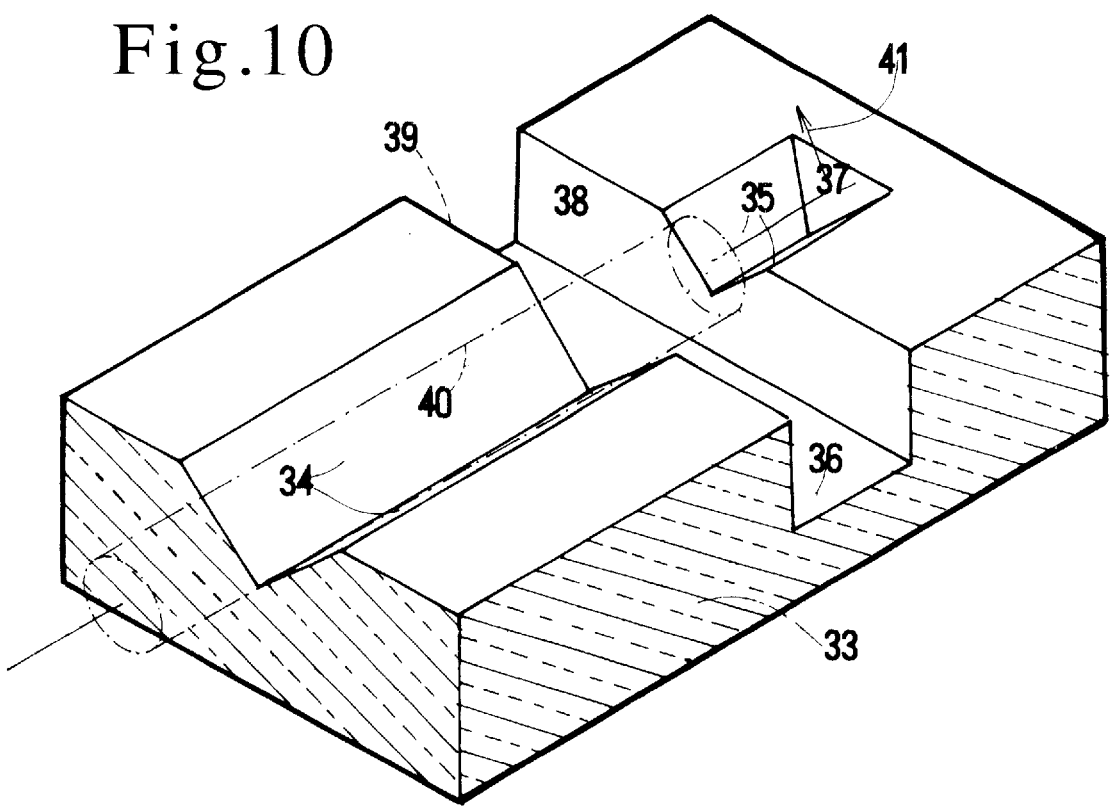
FIG. 10 is a perspective view of a part of a first embodiment PD module of the present invention.
Figure 11:
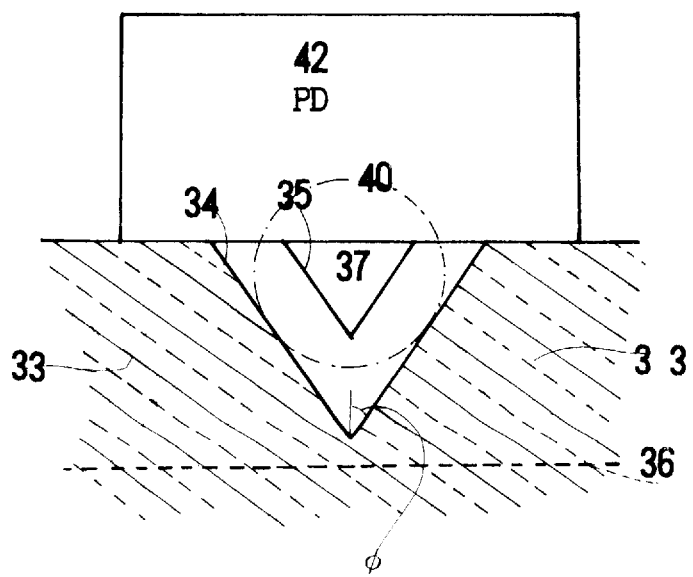
FIG. 11 is a lateral vertical sectioned view of the same part of the first embodiment PD module in the state carrying a PD chip.
Figure 12:
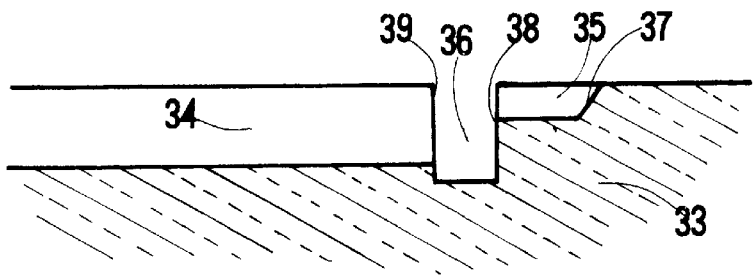
FIG. 12 is a longitudinal vertical section of the same part of the first embodiment PD module showing a bigger V-groove, a smaller V-groove and a partition groove.
Figure 13:
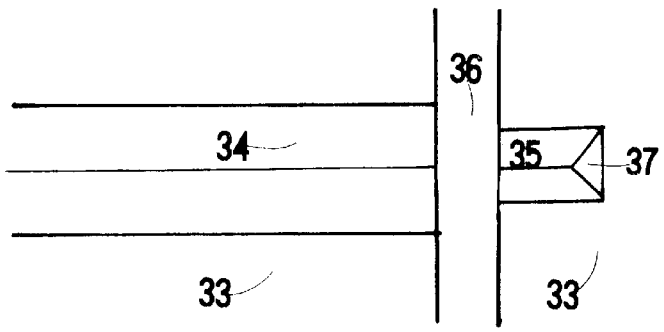
FIG. 13 is a plan view of the same part of the first embodiment PD module.
Figure 14:
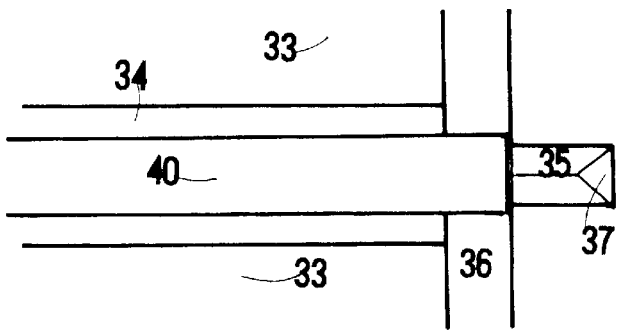
FIG. 14 is a plan view of the same part having an end of an optical fiber on the V-groove.

Embodiment 1 is explained by referring to FIG. 10 to FIG. 15. FIG. 10 is a perspective view of a part for supporting a fiber on the substrate. FIG. 11 is a lateral vertical section including the grooves of the substrate. FIG. 12 is a longitudinal section including the grooves of the substrate.

The prepared substrate is a (100) Si wafer 33. Since silicon has a conductivity, a Si substrate cannot be applied to the platform of the PD module as it is. For eliminating the conductivity, a $SiO_2$ film is made on the Si wafer by sputtering or anode oxidization. An appropriate thickness of the $SiO_2$ is 1 μm to several micrometers. The patterned photoresist is prepared on the $SiO_2$ coated Si substrate by painting a photoresist on the Si wafer, exposing the photoresist through a mask having [011] windows with a mercury lamp, developing the photoresist and perforating [011] windows in the resist. Then, the wafer covered with the photoresist is etched through the [011] windows of the resist layer by an etchant having a faster etching speed in (100) planes and a slower etching speed in (111) planes. The anisotropic etching makes the double V-grooves 34 and 35 coaxially in the direction [011]. The first V-groove 34 is deeper and wider than the second V-groove 35. The second V-groove 35 has a slanting reflection plane 37 at the end. The slanting reflection plane 37 plays the role of a mirror for introducing the rays into a PD. The set of the second V-groove 35 and the slanting reflection plane 37 is called a path-changing part. The slanting reflection plane 37 is e.g., a (111) plane. Since silicon has a high refractive index, the bare silicon surface has an enough reflection rate. Coating the slanting plane with a metal film of nearly 100% reflection rate is further effective to guide the rays to the PD. Single anisotropic etching can make the larger first V-groove 34, the smaller second V-groove 35 and the slanting plane 37 on the silicon substrate at a stroke, since the walls are {111}s.

Then, a partition groove 36 is made in the direction orthogonal to the V-grooves 34 and 35. If the partition groove should have vertical walls to the substrate, the partition groove cannot be made by the same anisotropic etching. The partition groove can be formed by the reactive ion etching (RIE) with a high aspect ratio. Otherwise, the partition groove can be also made by cutting mechanically by a dicing saw. The depth of the partition groove 36 is deeper than the V-grooves 34 and 35.

The partition groove 36 should have, preferably, vertical walls for positioning the end of a fiber. Instead of the vertical walls, another partition groove having slanting walls can position the end of the fiber. If the groove has slanting walls, the partition groove can be made by the same anisotropic etching for forming the V-grooves 34 and 35. This invention gives the partition groove two functions for storing the transparent adhesive and for positioning the fiber. Vertical walls are more suitable than slanting ones for the second role of positioning the fiber. Slanting walls are equivalent to vertical walls for storing the transparent adhesive. The partition groove 36 should have a deeper depth Q than the depths W and U of the V-grooves 34 and 35(Q>W>U). Slanting walls require a larger width to the partition groove 36 than vertical walls. As shown in FIG. 11, an end of an optical fiber (core+cladding; the coating has been eliminated) 40 is fixed on the first V-groove 34. A part of the fiber 40 appears above the surface. The center of the fiber lies below the surface of the substrate. The depth W of the first V-groove 34 should satisfy inequalities, $$(D/2)\text{cosec }\phi < W < (D/2)(1+\text{cosec }\phi), \tag{12}$$

where φ is half of the bottom angle of the groove 34, D is the diameter of the fiber. The depth W of the V-groove 34 is shallower than the V-grooves of prior art 1 and prior art 2. But the partition groove is deeper than the first V-groove 34. When the partition groove 36 is made by dicing process, a large depth and a small width can be made for the groove. The width is irrelevant to the depth in dicing.

The depth U of the second groove 35 is restricted by a condition that the bottom should be lower than the center of the fiber 40 and by another condition that the second groove 35 should be shallower than the first V-groove 34. The allowable range of U is $$W - (D/2)\text{cosec }\phi < U < W. \tag{13}$$

When the grooves are made by the anisotropic etching on the silicon substrate, half of the bottom angle is φ=35°. The slanting angle of the (111) reflecting plane 37 of the path-changing part is 54°. The side slanting walls of the V-grooves are (1-11) and (11-1). As shown in FIG. 12, the depths of the grooves are restricted by Q>W>U. A front wall 38 of the partition groove 36 has the function of stopping the end of the fiber 40. The space between the front wall 38 and a rear wall 39 will be filled with the transparent adhesive. As shown in the plan views of FIG. 13 and FIG. 14, the fiber 40 rides on the first V-groove 34 with the front end being in contact with the front wall 38. Although a PD chip is mounted on the substrate earlier than the fiber in practice, FIG. 10 exhibits the state of fitting the fiber 40 on the V-groove 34 for denoting the fiber end being positioned by the front wall 38 of the partition groove 36 and denoting the fiber end facing the slanting reflecting plane 37. A metal film is evaporated on the slanting plane 37 and the side walls of the V-groove 35 for enhancing the reflection rate. A PD chip 42 is fixed on the substrate surface just above the path-changing part. For the purpose, metallized patterns are prepared on the substrate. The suitable PD chip is a bottom surface incidence type PD which has a ring n-electrode on the bottom for allowing light beams to enter the PD via the bottom. The n-electrode is bonded on the metallized pattern of the substrate.

The PD chip is, for example, an InGaAs PD chip of a 450 $\mu$m square and a 200 $\mu$m thickness. Such a PD chip will be soldered at a predetermined spot on the metallized pattern. Then, the optical fiber 40 is inserted into the first V-groove 34 and temporarily pressed by a retaining tool. The contact of the fiber front end to the front wall 38 determines the position exactly. A drop of the transparent resin 43 is supplied (potted) to the space including the partition groove 36, the bottom of the PD 42 and the front end of the fiber. The potted rein should be an adhesive transparent to the light propagating in the fiber. The refractive index of the adhesive 43 should be nearly equal to that of the fiber. Silicone-type adhesive is suitable for the transparent adhesive for the sake of the optical property despite comparatively weak adhesion. The partition groove 36 helps the resin 43 to occupy the narrow space by enhancing the fluidity of the resin. The transparent resin (adhesive) 43 is indispensable for annihilating a void in the path between the fiber end and the PD chip 42.

However, the transparent adhesive is not sufficient for keeping the fiber 40 on the V-groove 34 because of the inherent weak adhesion. Another adhesive 44 having stronger adhesion should further be supplied to the fiber 40 and the V-groove 34 for tightly fixing the fiber 40 to the Si substrate 33. The second adhesive is called a "fixation adhesive" in contrast to the transparent adhesive. The optical property is a matter of little significance for the fixation adhesive 44. Namely, an opaque resin is available for the fixation adhesive 44. For example, an epoxy-type adhesive is suitable for the fixation adhesive due to strong adhesion. The epoxy adhesion is an opaque resin. The fixation adhesive plays not only the role of sticking the fiber to the substrate but also the role of protecting the transparent resin. The selective use of two different adhesives can satisfy the requirements of the adhesion strength and the optical transparency. No prior art has revealed such a contrivance.

Figure 15:
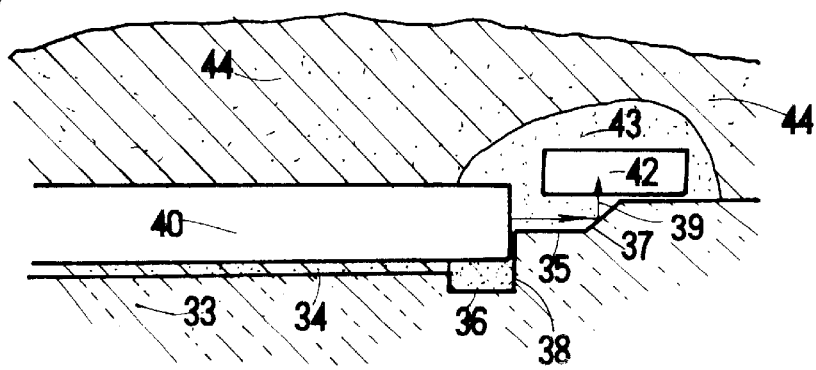
FIG. 15 is a longitudinal sectional view of the same part of the first embodiment PD module having a PD chip, an end of the fiber, a transparent adhesive covering the PD chip and a fixation adhesive enclosing the fiber and the transparent adhesive.

The PD 42 seems to be unstable from a glimpse at FIG. 15. In reality, the PD 42 is stable since the PD is supported on three sides around the V-groove 35, as shown in FIG. 13, FIG. 14, FIG. 10 and FIG. 11.

Figure 16:
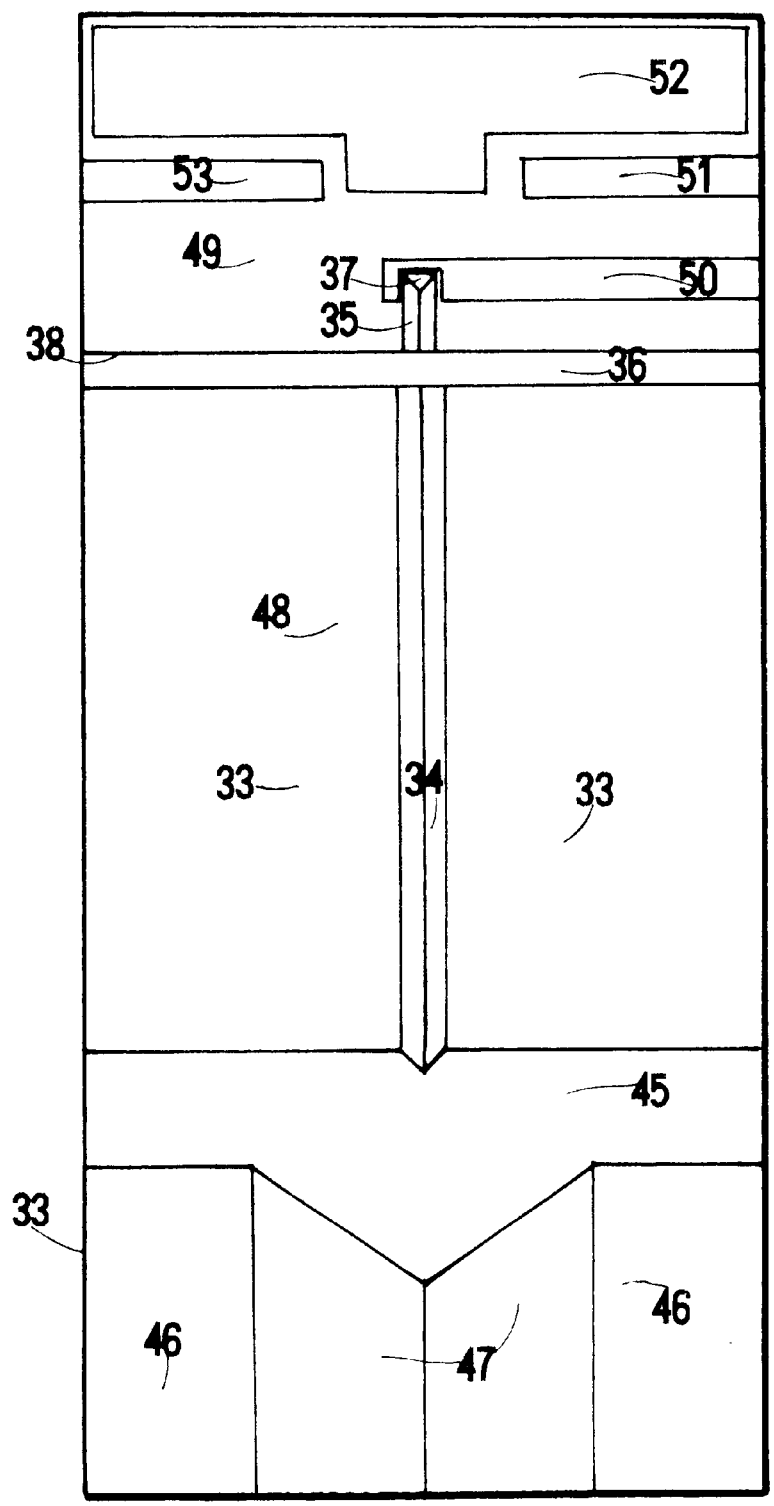
FIG. 16 is a plan view of a Si substrate having grooves and metallized patterns employed by the first embodiment of the present invention.

FIG. 16 is a plan view of the whole Si substrate 33. The V-groove 34 longitudinally extends at the center of the substrate 33. The smaller V-groove 35 follows the larger V-groove 34 along the center line. In general, a ferrule is attached to thin the end of a fiber. In the reverse direction to the smaller groove 35, a much larger V-groove 47 is formed for retaining the ferrule. The fiber 40 has a cladding of a 125 $\mu$m diameter. The ferrule has a bigger diameter than the cladding. The ferrule requires the large V-groove 47 made on a lower front step 46. In FIG. 16, a front wide slanting plane 45 is yielded by the same anisotropic etching as making the V-grooves 47,34 and 35. The middle step 48 has only the longitudinal V-groove 34 for the fiber.

The rear plateau 49 has printed metallized patterns 50, 51, 52 and 53 in addition to the path-changing part of the small second V-groove 35 and the mirror plane 37. The metallized patterns are either bases for mounting a PD, an amplifier IC, capacitors and other devices or wiring for connecting the electrodes of the devices to external lead pins. As explained before, the surface of the silicon substrate is covered with a $SiO_2$ insulating film. The metallized patterns are insulated from each other by the $SiO_2$ insulating film. Conductive silicon surfaces are exposed at the walls of the V-grooves. It does not matter, since the V-grooves are only in contact with an insulating fiber.

Figure 17:
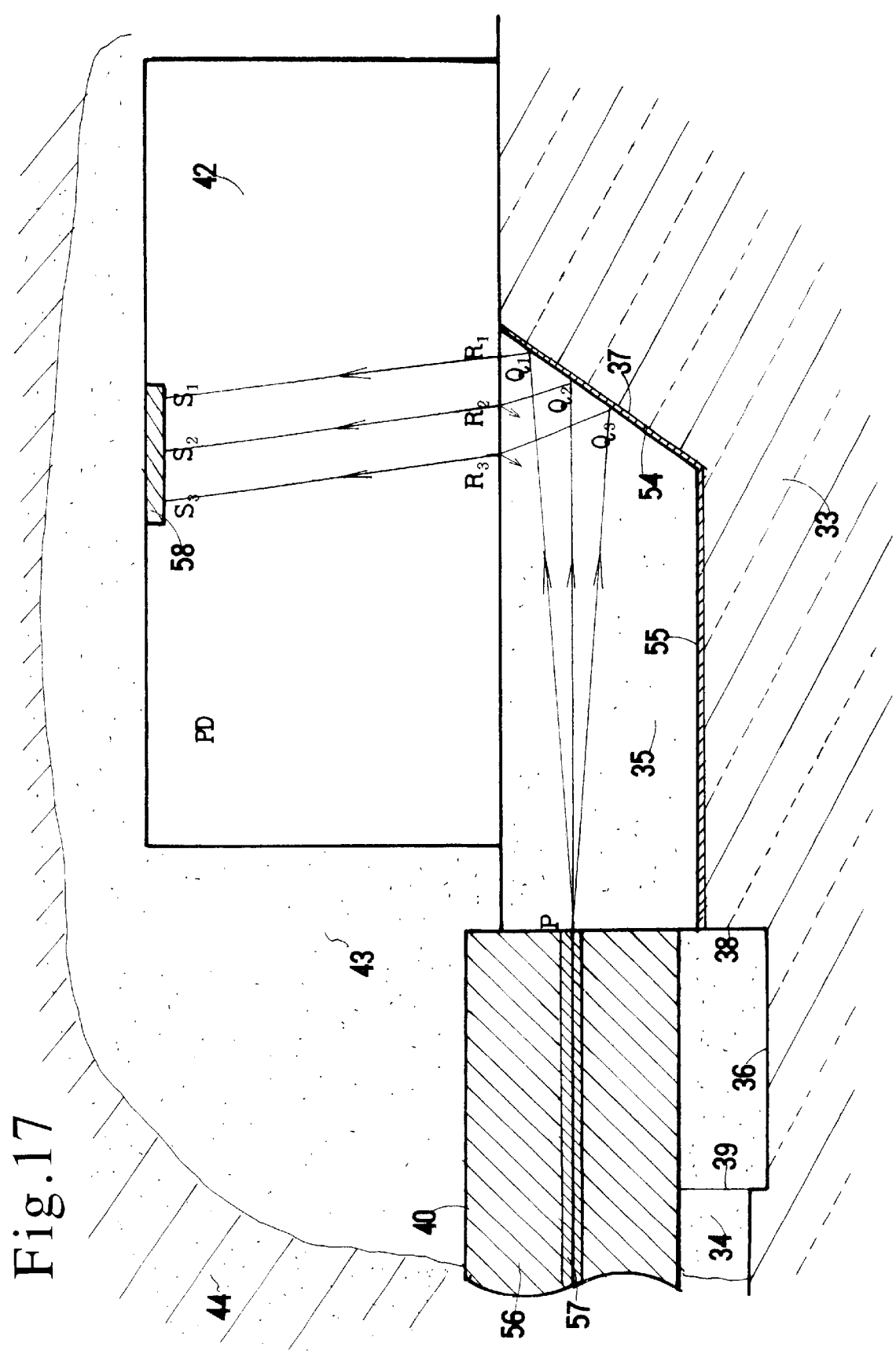
FIG. 17 is an enlarged longitudinal vertical section of a part of the path-changing part of the embodiment PD module.

FIG. 17 is an enlarged sectional view of the path-changing part depicted in FIG. 15. The optical fiber 40 consists of a core 57 and the cladding 56 which is in contact with the V-groove 34. The slanting walls of the second V-groove 35 and the slanting reflection plane 37 are coated with a metal film 54 and 55 for reinforcing the reflection. In FIG. 17, the end of the fiber stays higher than the bottom of the V-groove 35. The end of the fiber, however, is positioned by the front wall 38 of the partition groove 36. The V-groove 35 has a 71 degree bottom angle. Rays are emanating from the front end P of the fiber core 57. The rays disperse in a definite aperture angle. The aperture angle $\Theta$ is determined by the relation $\cos=n_1/n_0$, where $n_1$ is the refractive index of the cladding and $n_0$ is the refractive index of the core. Three rays are denoted by $PQ_1$, $PQ_2$ and $PQ_3$. These rays are reflected by the slanting plane 37 and are guided into the PD chip 42 via the bottom.

The slanting angle of the reflecting plane 37 is not 45 degrees but 54 degrees. The reflected rays $Q_1R_1$, $Q_2R_2$ and $Q_3R_3$ are not perpendicular to the surface. The rays obliquely go into the PD of a higher refractive index. The rays propagate to the upper light receiving part (p-region and the pn-junction) 58 which changes the light to a current. The reflected rays at the bottom points $R_1$, $R_2$ and $R_3$ do not return to the fiber along the light path. If the rays returned along the same path to the fiber, the rays would instabilize the light source LD. The use of the 54 degree of the slanting plane 37 enables this invention to avoid the difficulty of the returning light. Conventional cylindrical PD modules were used to polish the end of the fiber slantingly at eight degrees for suppressing the reflected beam from returning to the LD. This invention is immune from the slanting polishing of the fiber end. The end of the fiber 40 is actually cut at 0 degree, as shown in FIG. 17.

In the case of the near infrared light (1.55 $\mu$m or 1.3 $\mu$m) for signal transmission, the PD chip should be an InP type PD which is produced on an InP substrate by epitaxially growing light receiving layers of InGaAsP or InGaAs on the InP substrate and making a pn-junction by diffusing zinc (Zn). The kinds of the PD are contingent upon the wavelength of the signal light. For visible light, a Si PD or a Si APD (avalanche photodiode) is also available.

FIG. 18 is a perspective view of the Si substrate 33 provided with the fiber 40, the PD chip 42 or other devices. The PD 42 is soldered at the end of the metallized pattern 50 just above the path-changing part. An amplifier IC 59 is mounted by soldering on another metallized pattern 52. Planar capacitances (die-cap) 61 and 62 are equipped on the metallized pattern 52 for reducing noise by decreasing the impedance of the source lines. The PD 42 has an annular bottom n-electrode (cathode) and a top p-electrode. The n-electrode is joined to the metallized pattern 50. The top p-electrode is connected via a wire to an input of the amplifier IC 59. An output and a source pat of the amplifier are joined via wires to other metallized patterns 53 and 51. The metallized pattern 52 is a ground. The amplifier enables the PD module to suppress external noise by amplifying the photocurrent of the PD in the same package.

The electronic parts are soldered to the patterns by heating in a solder-reflow furnace. Then, an optical fiber 40 accompanied by a ferrule 60 is fixed to the Si substrate 33 by inserting the cladding to the first V-groove 34 and putting the ferrule 60 onto the large V-groove 47 and adhering the ferrule 60 and the cladding by two steps of supplying two kinds of adhesives. The first step is to supplying (potting) a transparent adhesive to the restricted space including the end of the fiber 40, the partition groove 36 and the second V-groove 35. The second step is to replenishing an opaque fixation adhesive to the extra part around the ferrule 60 and the cladding of the fiber 40.

FIG. 19(1) and FIG. 19(2) are plan views of parts of FIG. 18. FIG. 19(1) denotes the base for mounting a PD chip. The metallized pattern 50 extends from an edge of the substrate to the central part. The metallized pattern 50 has a notch including the second V-groove 35. An electrode pad 66 is formed on the notched metallized pattern 50 by evaporation or plating (e.g., Au—Sn). Four marks 67, 68, 69 and 70 are affixed at the corners of the metallized pattern 50 in the vicinity of the electrode pad 66 for positioning the PD 42 upon the pad. FIG. 19(2) shows the butting part of the fiber end against the front wall 38. The rays emitted from the fiber 40 are dispersed and reflected by the slanting plane 37 and are guided into the PD 42. FIG. 19(3) denotes the rays emanating from the fiber, reflecting on the reflecting plane 37 and entering the PD 42. FIG. 19(4) shows the section of the bigger V-groove 34 and the cladding of the fiber 40. FIG. 19(5) denotes the section of the smaller V-groove 35 and the beam spot on the slanting plane 37.

The half product in FIG. 18 is fitted upon a central part of a lead frame made by punching a metal plate. The lead frame has a plurality of leads extending inward. The patterns are connected to corresponding leads by wires. Then, the silicon substrate and the lead frame is inserted into a metallic mold. Fluid plastic is supplied into the metallic mold and is solidified in the mold. Extra parts extending from the solidified plastic are cut off. The solidified plastic becomes a package. A plastic mold type PD module is produced. Since the package is made from plastics, the PD module is inexpensive. The prior metal package PD module which stores a PD chip in a hermetic sealed cylindrical metal package is expensive due to the costly package and the complicated assembly. The plastic mold package is one of the features of the present invention.

Figure 20:
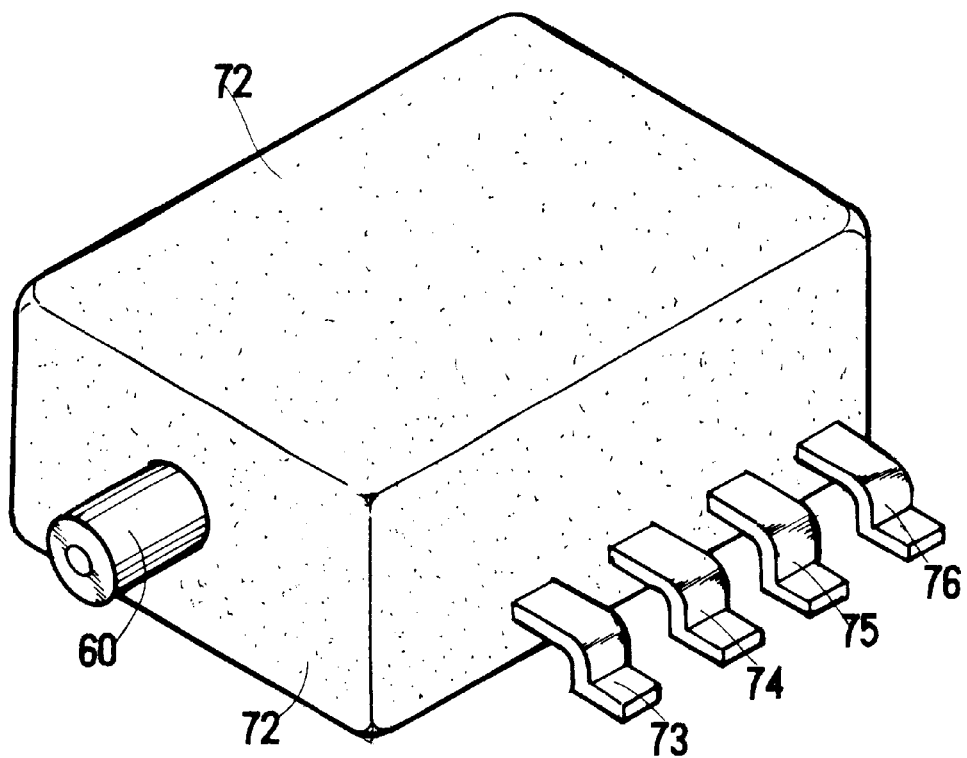
FIG. 20 is a perspective view of the embodiment PD module having the Si substrate, the PD and the other electronic device sealed in a plastic molding package.
Figure 21:
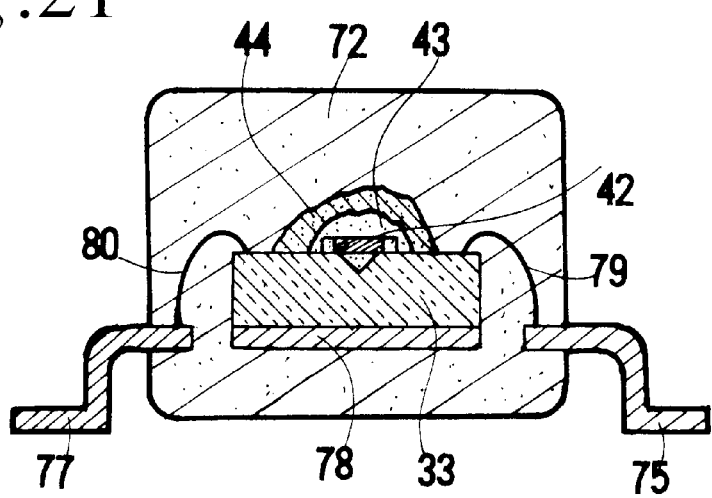
FIG. 21 is a lateral vertical sectional view of the same embodiment PD module sectioned along a line including the PD as FIG. 20.
Figure 22:
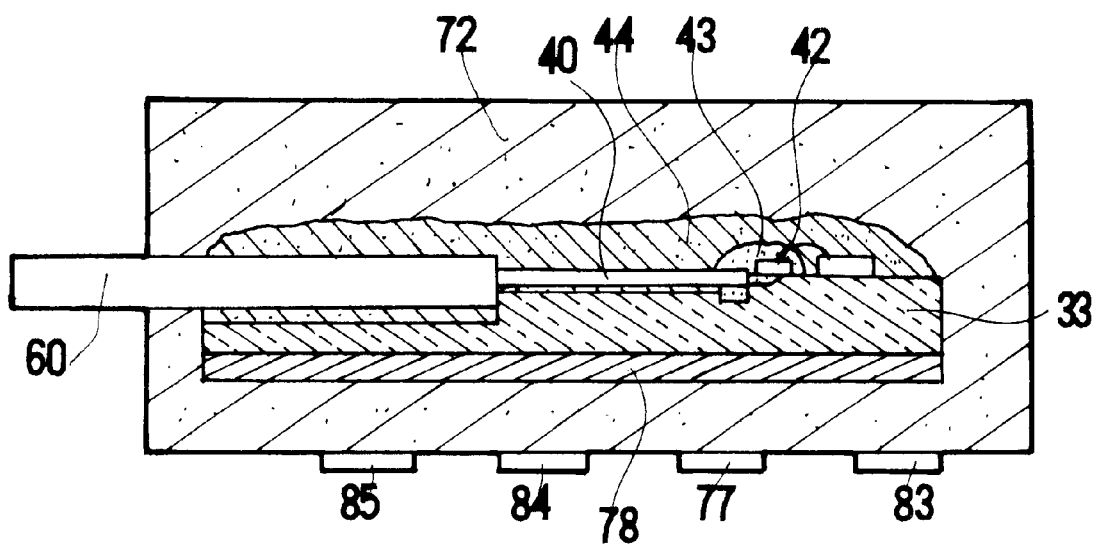
FIG. 22 is a longitudinal vertical sectional view of the same embodiment PD module as FIG. 20.
Figure 23:
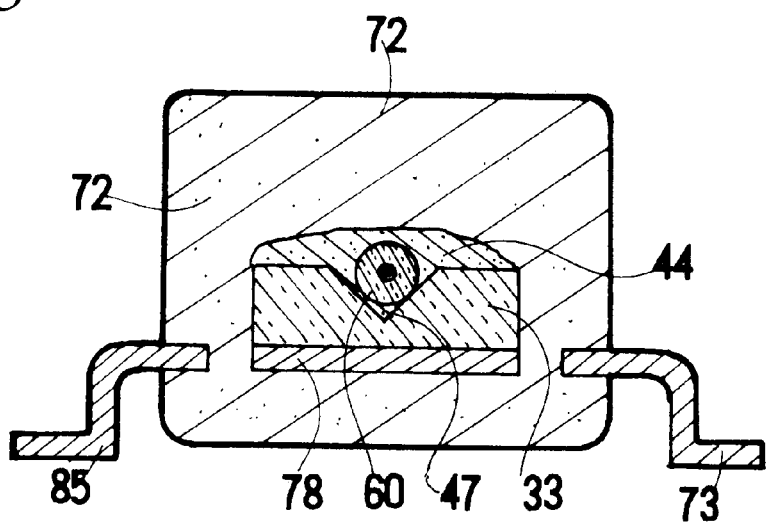
FIG. 23 is a lateral vertical sectional view of the same embodiment PD module sectioned along a line including the ferrule and the V-groove as FIG. 20.

FIG. 20 is a perspective view of the complete PD module. FIG. 21 is a lateral sectional view of the PD module. FIG. 22 is a longitudinal sectional view of the PD module. FIG. 23 is a lateral sectional view of the same module in the vicinity of the ferrule. A transparent adhesive 43 covers the light path between the fiber 40 and the PD 42. A fixation adhesive 44 protects the transparent adhesive 43, the fiber 40 and the ferrule 60. A cheap plastic 72 further encloses the whole of the substrate 33, a lead frame 78, the fixation adhesive 44. Lead pins 73, 74, 75, 76, 77, 83, 84 and 85 extend from both sides of the plastic mold package 72. The appearance is similar to ordinary mold type ICs. A different feature is the ferrule 60 projecting from the front face for coupling to an optical fiber.

The explained examples are PD modules for only a single fiber. This invention is also applicable to a PD module having plural PDs for plural fibers.

[Embodiment of Three-fiber Type PD Module]

Figure 24:
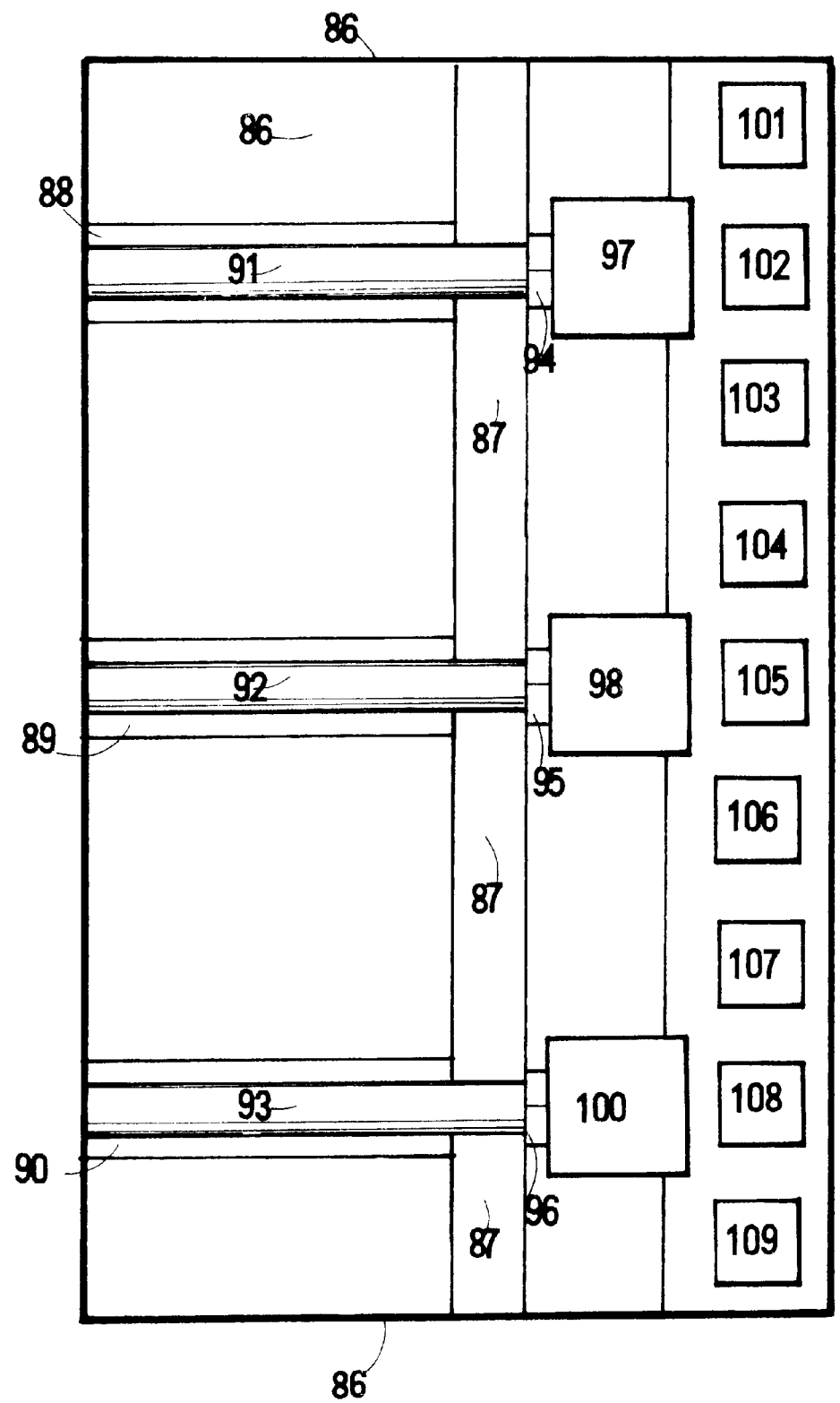
FIG. 24 is a plan view of a substrate of a three-fiber type PD module, which is an application of the first embodiment PD module.

FIG. 24 is a plan view of a Si substrate 86 of another embodiment applied to a three-fiber type PD module. A single common partition groove 87 is dug laterally on the Si substrate 86. Three longitudinal V-grooves 88, 89 and 90 are formed vertically to the common partition groove 87 in left half of the substrate 86 in FIG. 24. Smaller second V-grooves 94, 95 and 96 follow the first V-grooves 88, 89 and 90. The ends of the second V-grooves are assigned to slanting reflecting planes. A path-changing part consists of the second V-groove and the reflecting plane. Similarly to the former embodiment, the V-grooves can be made by the anisotropic etching. The partition groove 87 can be cut by the dicing saw. The partition groove can also be made by a directional etching, for example, RIE (reactive ion etching). The V-grooves can be formed by mechanical tools.

PDs 97, 98 and 100 are fitted upon the substrate above the path-changing parts. Electronic devices 101, 102, . . . , 109 are mounted on the rear bank of the Si substrate 86. The electronic devises are here amplifiers, capacitors or wave reformers. The first wider V-grooves 88, 89 and 90 keep fibers 91, 92 and 93. The path-changing parts are full of the transparent adhesive. The fibers are maintained by the fixation adhesive. This example is three-fiber type. Besides, four fiber type or more than four fiber type PD module can be designed in accordance with the teaching of the present invention. Unlike the former embodiment of FIG. 18, the three-fiber type embodiment has fibers 91, 92 and 93 not extending outward. This embodiment aims at coupling to a tape fiber assembly which has an array of fibers which do not extend outward also. Of course, a variation having ferrules projecting outward like FIG. 20 is possible for the embodiment of FIG. 24. FIG. 24 shows only the skeleton of the PD module. In practice, the whole of the substrate and the fibers will be molded by plastic. The embodiment is also a plastic mold package type device. Since the package is made from cheap plastic, the multi-fiber PD device is far more inexpensive than the metal package devices or the ceramic package devices.

[Embodiment of Five Fiber Type PD Module]

Figure 25:
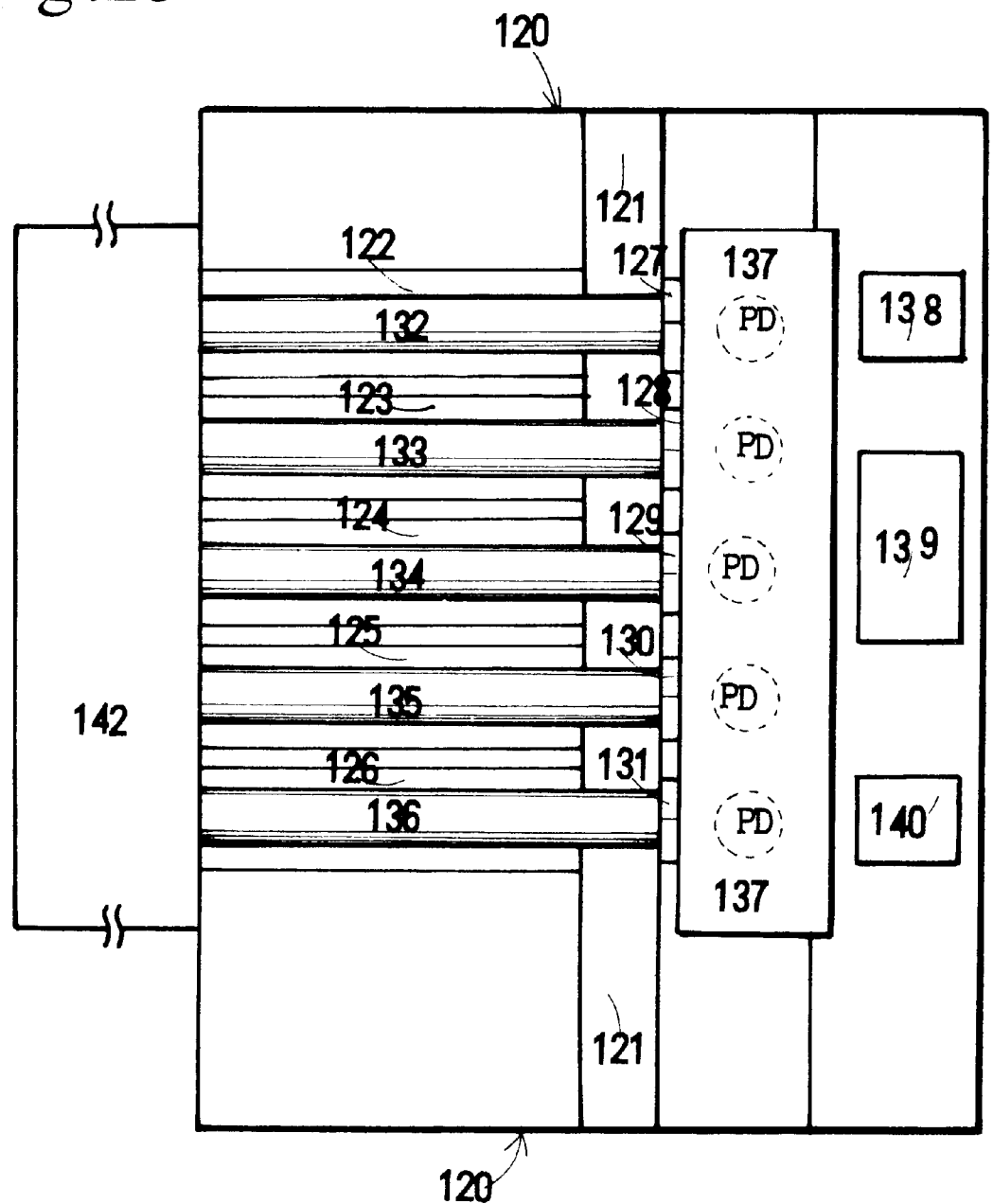
FIG. 25 is a plan view of a substrate of a five-fiber type PD module, which is an application of the first embodiment PD module.

FIG. 25 shows another embodiment of a five fiber type PD module. A wide rectangular Si substrate 120 having grooves are prepared by a wafer process on a Si wafer. The Si substrate 120 has a common lateral partition groove 121 and five parallel V-grooves 122, 123, 124, 125, and 126 which are vertical to the partition groove 121. Smaller and shorter V-grooves 127, 128, 129, 130 and 131 follow larger and longer V-grooves 122 to 126 on the same axial lines. The smaller grooves 127 to 131 are ended with slanting reflective (111) planes. An array 137 of PDs is attached above the reflecting planes on the substrate 120. Unlike the former embodiment of FIG. 24, this embodiment employs an array of PDs instead of isolated PDs. The embodiment has an advantage of sparing the time for alignment of the individual PDs. Electronic devices 138, 139 and 140, for example, capacitors, amplifiers or so, are installed upon the rear bank of the Si substrate 120. Optical fibers 132, 133, 134, 135 and 136 are embedded in the V-grooves 122 to 126. The fibers 132 to 136 do not project outward from the front surface. The front surface is smooth. FIG. 25 shows only the skeleton. The substrate 120, the fibers, the PD array 137 and the devices will be enclosed by molding plastic for a complete multi-fiber PD module. A five-fiber type connector will be attached by some means in front of the module for communicating with the inner fibers 132 to 136. The first category of the present invention have been explained hitherto. Another category of the present invention including the path-changing groove will further be explained from now onward.

[Embodiment 2: V-groove+Partition Groove+Smaller V-groove+Path-Changing Groove]

Figure 26:
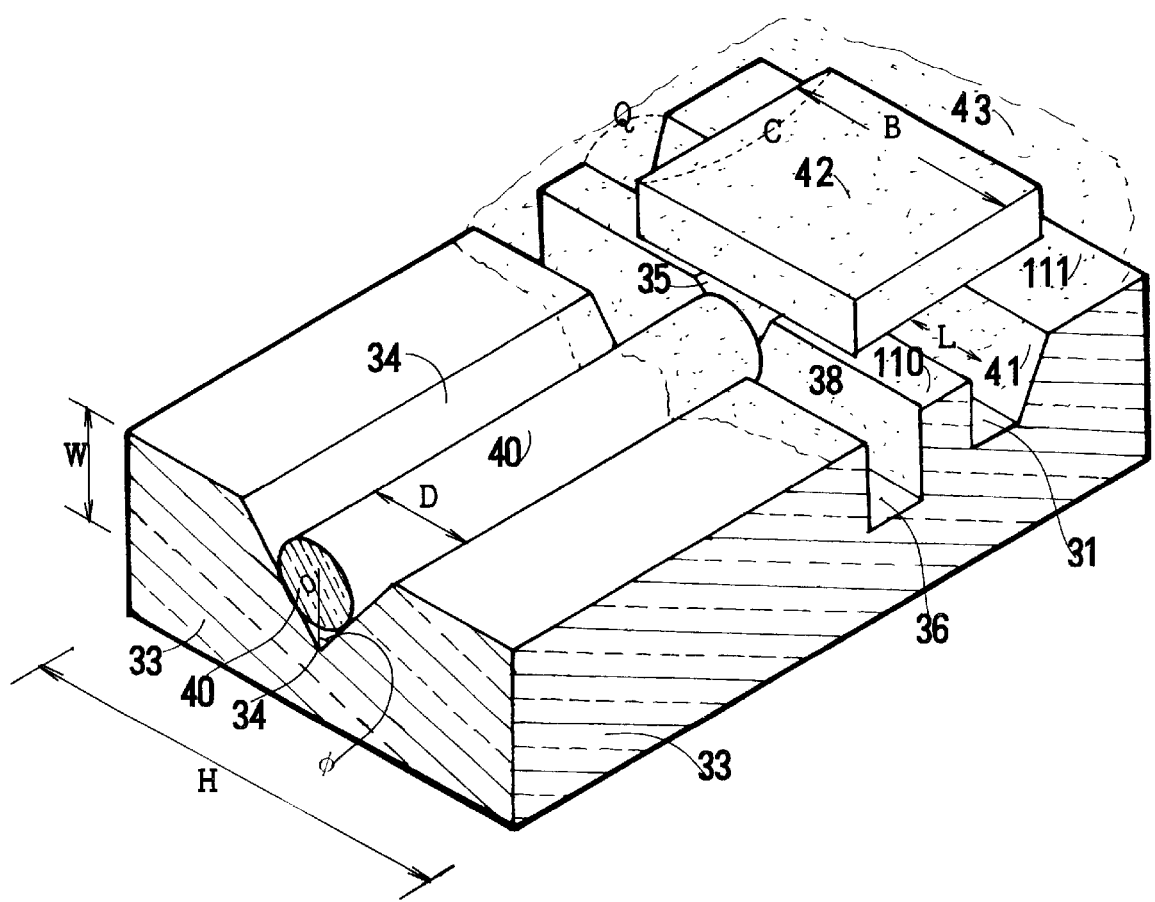
FIG. 26 is a perspective view of a second embodiment having a path-changing groove behind the partition groove for facilitating the pervasion of the transparent adhesive into a space beneath the PD chip.
Figure 27:
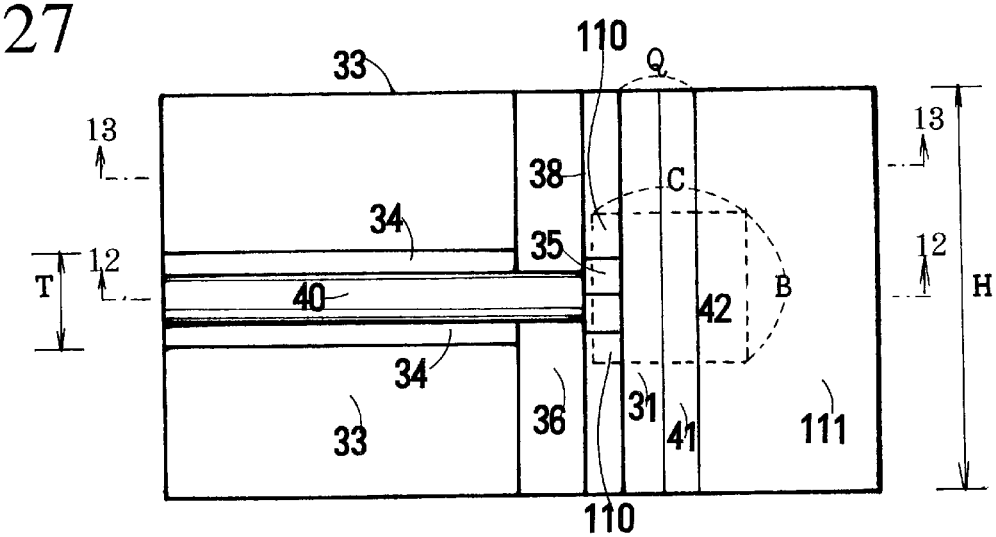
FIG. 27 is a plan view of the same embodiment having the path-changing groove in addition to the partition groove, the V-grooves, in which dotted line depicts a PD chip.
Figure 28:
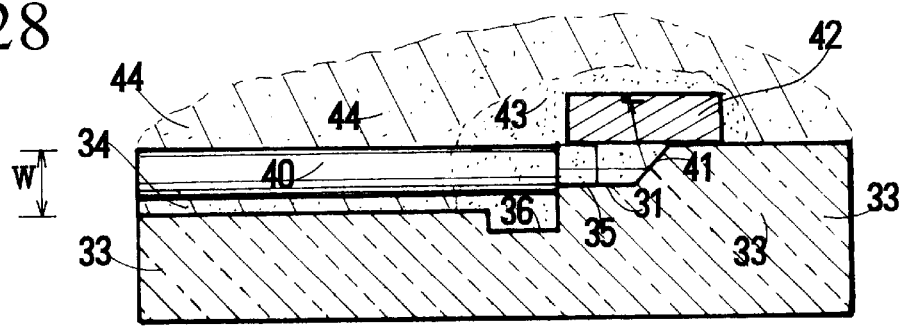
FIG. 28 is a longitudinal sectional view of the same embodiment taken along a line 12—12 in FIG. 27, the substrate having the longitudinal V-grooves, lateral partition groove, the lateral path-changing groove and the PD chip and being protected by a transparent adhesive and a fixation adhesive.
Figure 29:
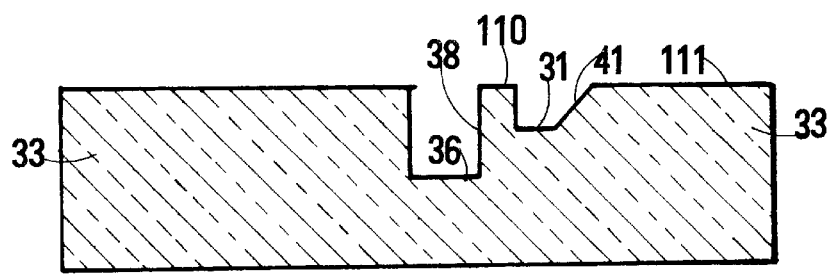
FIG. 29 is a longitudinal sectional view of the substrate taken along a line 13—13 in FIG. 27.
Figure 30:
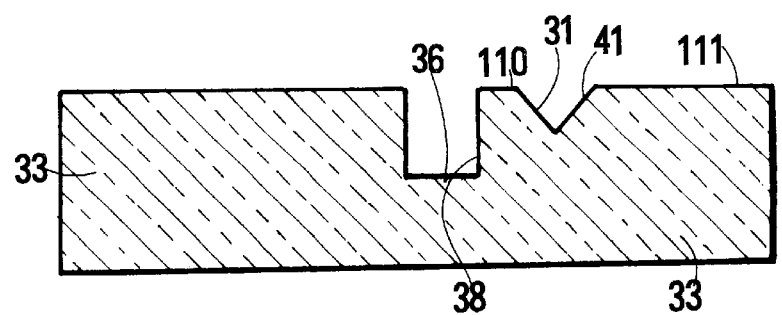
FIG. 30 is a longitudinal sectional view of another substrate taken along a similar line of FIG. 29, in which the path-changing groove is changed to a V-groove.
Figure 31:
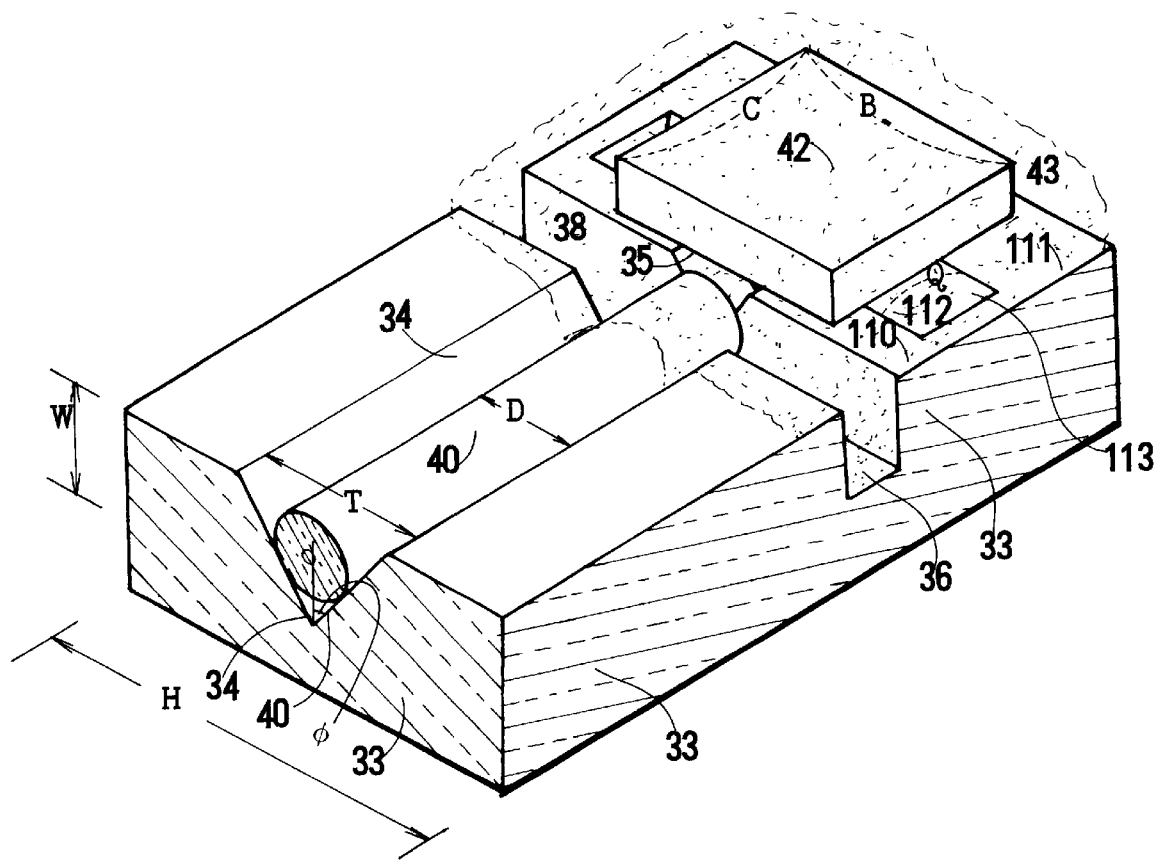
FIG. 31 is a perspective view of a third embodiment PD module having a path-changing groove shorter than the full width of the substrate.
Figure 32:
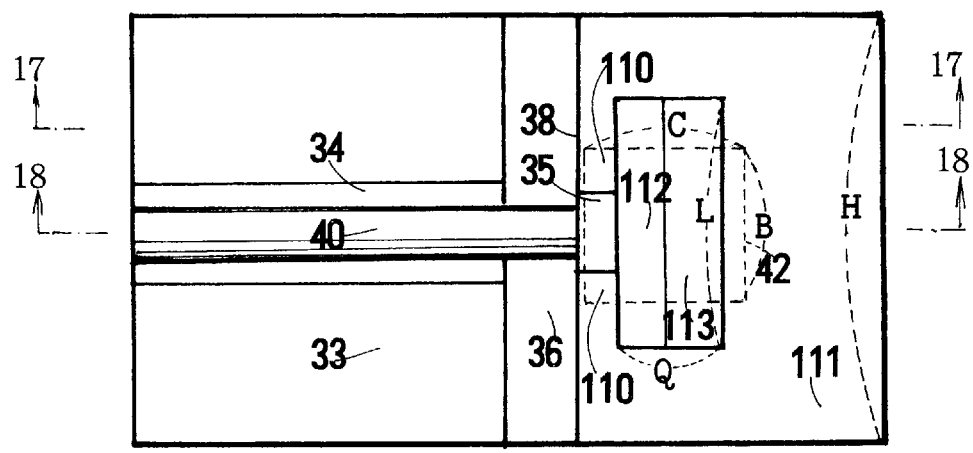
FIG. 32 is a plan view of the same embodiment PD module having the shorter path-changing groove and a fiber end in the V-groove.

FIG. 26 to FIG. 30 demonstrate a second embodiment including a path-changing groove. FIG. 26 shows a part of coupling a fiber to a PD in a perspective view. FIG. 27 is a plan view of a similar part. FIG. 28 is a section taken along a line 12—12 in FIG. 27. FIG. 22 is a section taken along a line 13—13 in FIG. 27. FIG. 30 shows a similar section of a variation.

Besides the partition groove, this category adds a path-changing groove to the former category which has been explained. The path-changing groove aims at facilitating the transparent adhesive to occupy the path between the fiber end and the PD without void. The platform as a substrate has a plurality of grooves. The grooves are formed either by mechanical tools or by wet etching. When the grooves are made by mechanical tools, the material of the substrate may be a metal, a ceramic or another insulator. When the grooves are formed by anisotropic etching, the substrate is preferably a (100) silicon single crystal. In the case of the Si substrate, a $SiO_2$ film should be formed on the silicon substrate by sputtering or oxidization. The thickness of the $SiO_2$ film should be 1micrometer to several micrometers for insulating the surface of the substrate. A patterned resist film is prepared by the steps of painting a photoresist on the substrate, laying a mask having patterns of windows in [011]-direction on the resist-coated substrate, exposing the resist through the mask, and developing the resist. The resist film has [011] direction windows. [011]-directing V-grooves are formed by etching the substrate through the mask with a special etchant having a faster etching rate in [100] direction and a slower etching rate in [111] direction. The difference of the etching speeds forms a [011] directed V-groove 34 by making {111} side walls in the [110] windows. The depth and the width of the V-groove 34 are determined for maintaining the fiber. A partition groove 36 is dug laterally at the inner end of the V-groove 34. As shown in FIG. 28 and FIG. 29, the partition groove 36 is deeper than the V-groove 34. The partition groove 36 can be formed either by etching or by a mechanical tool, for example, a dicing saw. It is better for the partition groove 36 to have a perpendicular walls for the purpose of positioning the end of the fiber. But a partition groove of slanting walls is also available.

A smaller V-groove 35 is formed on the side over the partition groove 36. The V-groove 35 is a short, small groove. A path-changing groove 31 is further made at the end of the second V-groove 35 in a lateral direction. The second category is featured by the path-changing groove 31. The path-changing groove 31 has a vertical rear wall and a slanting front wall 41. The slanting front wall 41 extends from a side to another side. The slanting front wall 41 has the role of reflecting the beam emanating from the fiber up to a PD chip 42. Since the wall 41 of the groove 31 changes the path of the light, the groove 31 is called a path-changing groove. The width Q of the path-changing groove 31 is smaller than the length C of the PD 42. The path-changing groove 31 may have a naked Si surface. The slanting reflection wall 41 has an enough reflection rate due to the difference between silicon and air. It is preferable to form a metal film (e.g., Al or Au) by evaporation on the slanting reflection wall 41 or the path-changing groove 31 for enhancing the reflection. The metal film can raise the reflection rate up to about 100%.

The embodiment forms four grooves 34, 35, 36 and 31 on the substrate. These grooves can be made by mechanical processing using a blade. Otherwise, the grooves can be made by the anisotropic etching. Hybrid use of the mechanical tool and the anisotropic etching is also available. The RIE etching is applicable to the formation of the vertical walls of the partition groove and the path-changing groove.

In the case of the anisotropic etching, the direction of the V-grooves should be determined to be [011]-direction. The walls of the V-grooves 34 and the 35 are a (1-11) plane and a (11-1) plane. The reflection plane 41 is a (111) plane. The direction of the partition groove 36 and the path-changing groove 31 is [0-11]. The vertical walls of the partition groove 36 are (0±1±1) planes.

Figure 1:
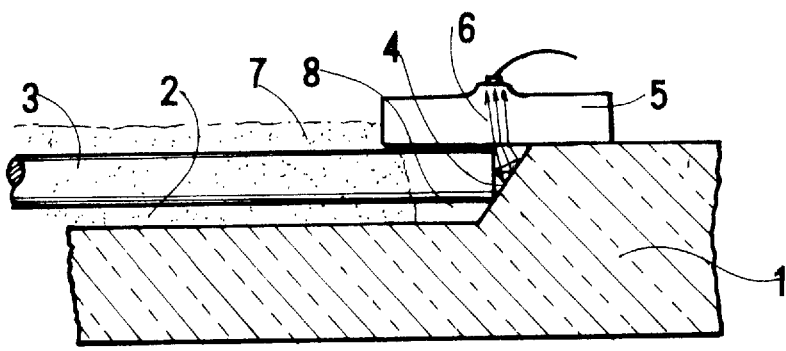
FIG. 1 is a vertically sectioned view of a part of the PD module suggested by German Patent DE3543558 C2 and by B. Hillerich & A. Geyer, "Self-aligned flat-pack fiber-photodiode coupling", ELECTRONICS LETTERS VOL.24, NO.15, P918 (1988).
Figure 2:
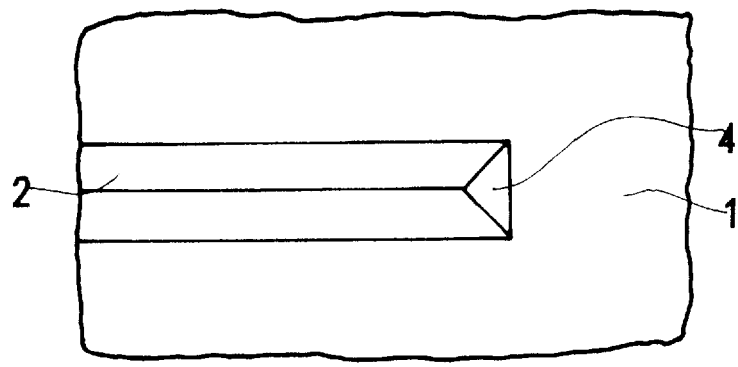
FIG. 2 is a plan view of a part including a V-groove of the same PD module as FIG. 1.
Figure 3:
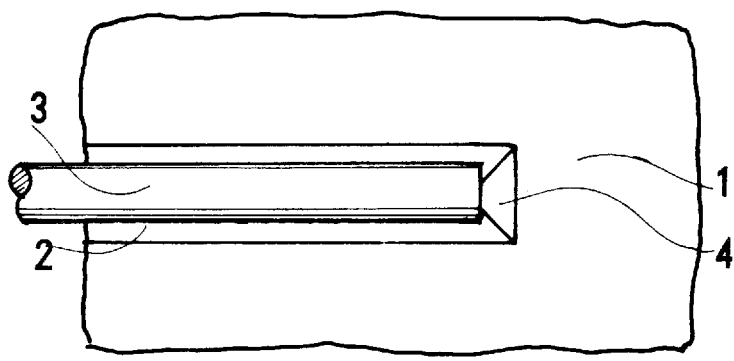
FIG. 3 is a plan view of the part of the V-groove having an end of a fiber thereon.
Figure 4:
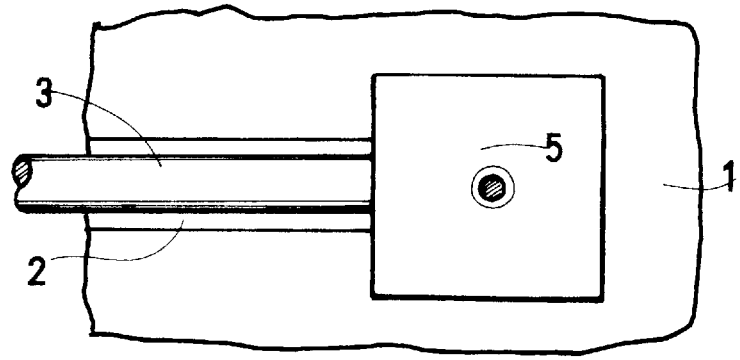
FIG. 4 is a plan view of the part of the V-groove and the fiber having a PD chip covering the end of the fiber.
Figure 5:
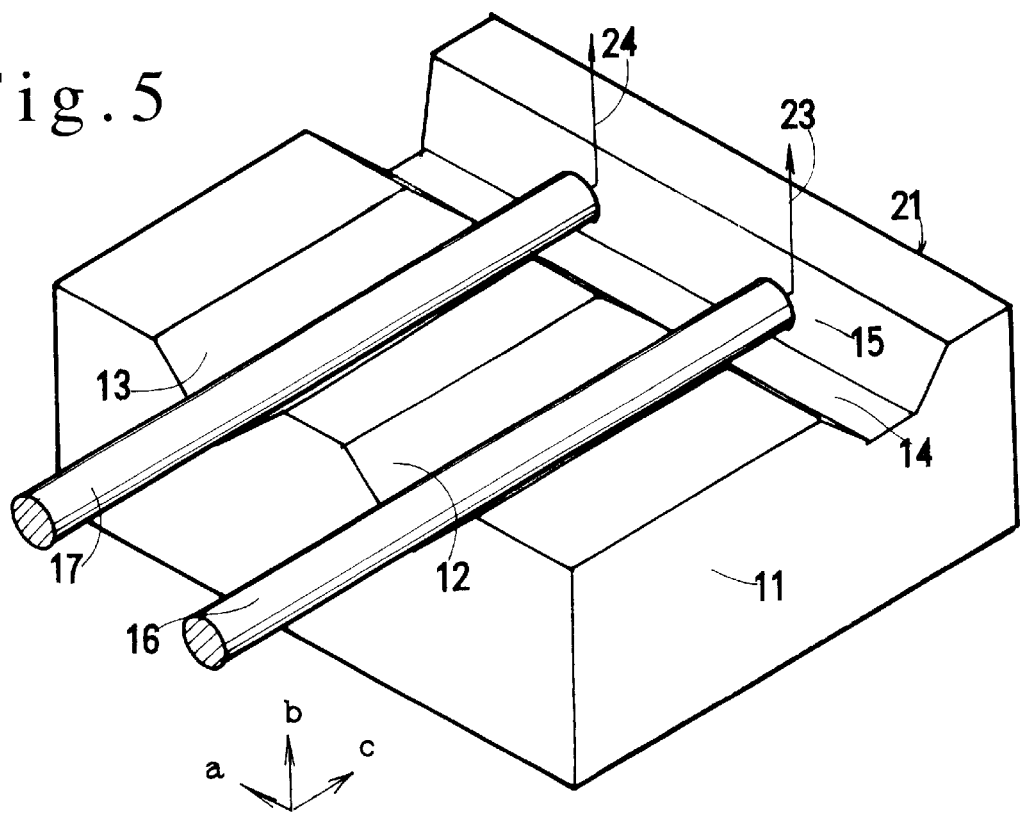
FIG. 5 is a perspective view of a first substrate of the PD module proposed by Japanese Patent Publication No.63-22565 (22565/'88).
Figure 6:
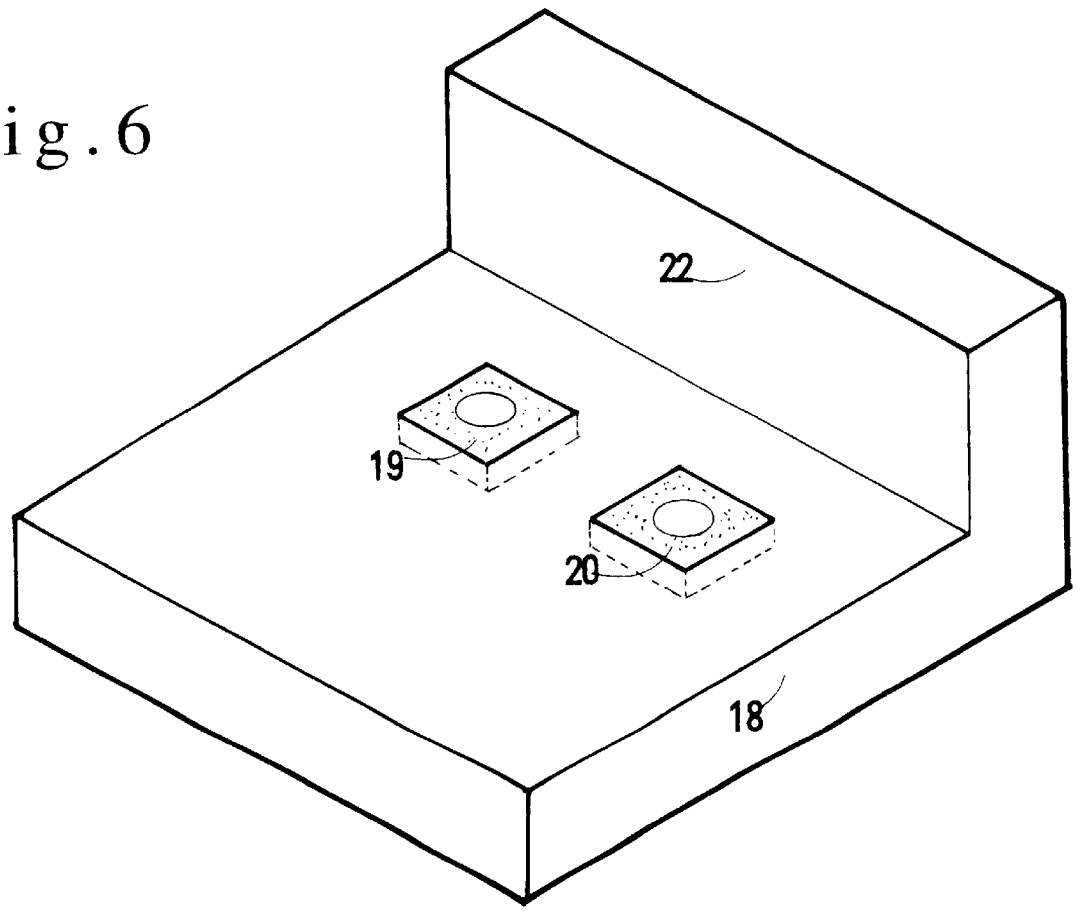
FIG. 6 is a perspective view of a second substrate of the PD module proposed by Japanese Patent Publication No.63-22565 (22565/'88).
Figure 7:
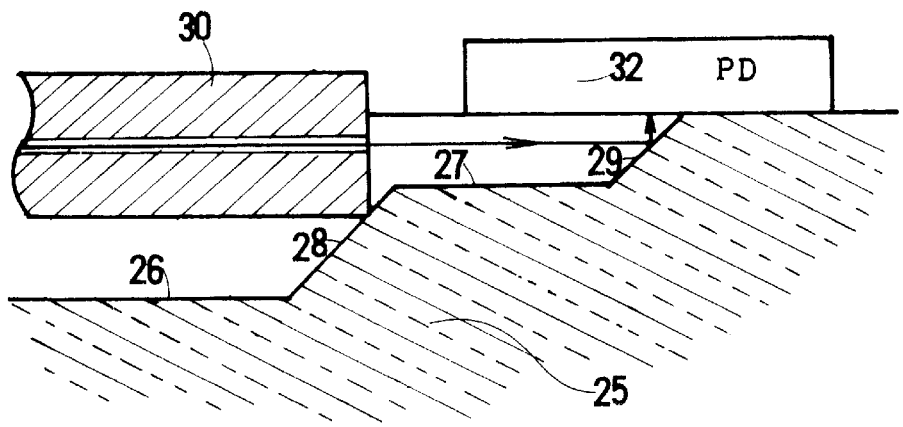
FIG. 7 is a longitudinal vertical sectioned view of a part of the PD module suggested by Japanese Patent Laying Open No.9-54228 (54228/'97).
Figure 8:
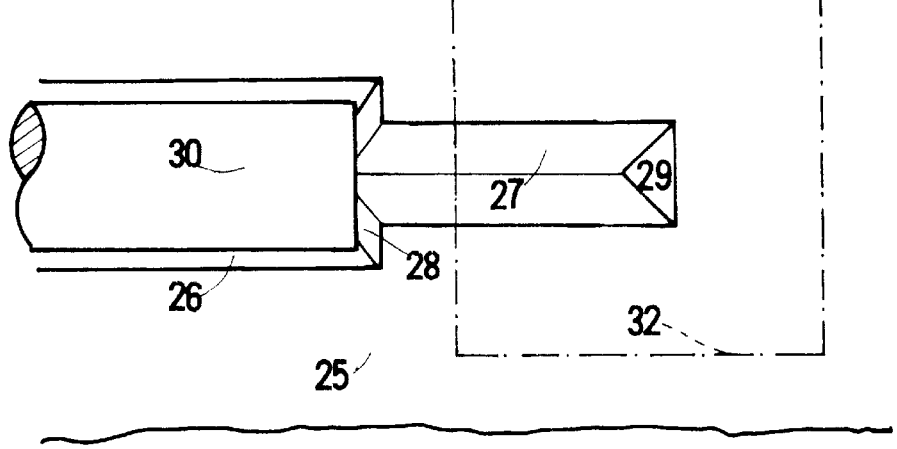
FIG. 8 is a plan view of the same part as FIG. 7 of the PD module suggested by Japanese Patent Laying Open No.9-54228 (54228/'97).
Figure 9:
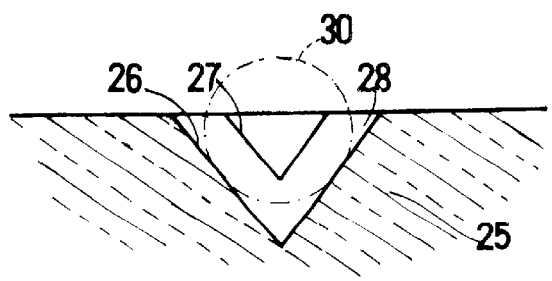
FIG. 9 is a lateral vertical sectioned view of the double V-grooves of the same part as FIG. 7 and FIG. 8.

A narrow stripe 110 remains on the surface of the substrate between the partition groove 36 and the path-changing groove 31. A wide rear surface 111 exists beyond the path-changing groove 31. The stripe 110 and the rear surface 111 have a role as a base of the PD chip. Spanning the path-changing groove 31, the PD chip 42 lies upon the both sides of the stripe 110 and the rear wide surface 111. The PD 42 is fixed by die-bonding at the three regions on the substrate 33. The existence of the two regions on the stripe 110 is important. Two small regions on the stripe 110 contribute to the base of the PD. If there were no stripe 110, supporting of the PD would require another substrate like the prior art of FIG. 5 and FIG. 6. The narrow two regions on the stripe 110 dispense with a substrate. The smallness of the second V-groove 35 is essential to keep the inner edges of the stripe 110 as the bases.

An optical fiber (core+cladding) 40 deprived of the coating is inserted into the V-groove34. The axial position of the fiber 40 is rigorously determined by the front wall 38 of the partition groove 36, as shown in FIG. 26 to FIG. 28. A transparent adhesive 43 is potted to the space including the fiber end, the front part of the V-groove 34, the narrow V-groove 35, the partition groove 36, PD chip 42, and the path-changing groove 31. The transparent adhesive 43 should have a refractive index similar to the fiber for suppressing the reflection at the end of the fiber 40. The transparent adhesive is, e.g., silicone type resin. The silicone type resin can be half-hardened by irradiating ultraviolet rays or by heating. The resin is not completely hardened. After the hardening step, the transparent resin still keeps an elastic state like a gelatin which reduces the occurrence of inner stress.

The optical fiber 40 is stuck to the V-groove 34 by a strong fixation adhesive 44 different from the transparent adhesive 43. The fixation adhesive 44 covers the transparent adhesive 43 and tightly glues the fiber 40 to the V-groove 34.

The fixation adhesive 44 need not be transparent for the light. Opaque adhesive is also available. The fixation adhesive 44 is free from the restriction on the refractive index. Strong adhesion is a requirement for the fixation adhesive 44. The fixation adhesive 44 encloses the gelatinous transparent adhesive 43. For example, an epoxy resin is employed for the fixation adhesive 44. Since the outer fixation adhesive 44 protects the inner gelatinous transparent adhesive 43 like a skeleton, no external stress acts on the transparent adhesive 43. The inner transparent adhesive 43 does not lose inherent elasticity. The outer fixation adhesive 44 protects the inner transparent adhesive 43. This invention has a feature of using two different adhesives for exploiting the complementary properties of two different adhesives. No prior art alluded to the complementary use of two different adhesives.

The partition groove 36 and the path-changing groove 31 extend in the lateral direction from a side to the other side. The lateral extension facilitates the transparent adhesive 43 to pervade the space beneath the PD chip 42 without leaving a void. This invention is entirely different from the prior art of FIG. 1 to FIG. 4 in the laterally-extending path-changing groove. The V-groove 34 which determines the exact position of the fiber 40 excludes the alignment operation of the fiber to the PD. Elimination of the alignment reduces the cost of production. The PD chip 42 is exactly mounted at a suitable spot on the substrate 33 by the aid of the four positioning marks printed on the substrate.

FIG. 30 shows an another embodiment which has a V-sectioned path-changing groove 31. The essential feature of the path-changing groove is the slanting reflective plane 41. Thus, the V-section is also allowable for the path-changing groove 31. In this embodiment, the rays emanating from the fiber 40 pass through the smaller V-groove 35, shoot the slanting plane 41 and rise up into the PD chip 42.

φ denotes half of the bottom angle of the V-groove. When the anisotropic etching makes the V-groove, φ is 35 degrees. The slanting angle of the slanting plane 41 (111) of the path-changing groove 31 is 54 degrees. The slanting planes of the V-groove 34 are (1-11) and (11-1) planes. In practice, mounting the PD chip 42 precedes the attachment of the fiber 40. The slanting plane 41 and the second groove 35 should be coated with a metal film by evaporation for raising the reflection rate. The PD chip 42 is positioned just above the path-changing groove 31 on the substrate 33. A metallized pattern has been printed on the substrate for bonding the PD chip 42 thereon. A bottom incidence type PD is suitable for the embodiment. The bottom incidence type PD has an annular n-electrode on the bottom surface for allowing light to go into the PD. The PD 42 is fixed by bonding the bottom electrode on the metallized pattern.

The PD chip is, for example, a 450 μm square InGaAs PD with a 200 μm thickness (B=450 μm, C=450 μm). The PD chip 42 is soldered at the determined position on the stripe 110 and rear bank 111. The width Q of the path-changing groove 31 should be less than 450 μm (Q<C). Furthermore, since the margins of bonding are necessary for the bank 111 and the stripe 110, the width Q of the path-changing groove 31 preferably is 150 μm to 250 μm. The front end of the fiber 40 is slightly distanced from the PD chip 42. Unlike the prior PD module of FIG. 1 to FIG. 4, the fiber does not submerge beneath the PD chip. The ridge of the fiber 40 may be either lower or higher than the substrate surface. The ridge can be just as high as the substrate surface. Here, W is the depth of the V-groove, φ is half of the bottom angle and D is the cladding diameter of the fiber. The extra projection of the fiber ridge from the surface is given by, $$\Delta h = (D/2)(1+\text{cosec } \phi) - W \quad (14)$$

[Embodiment 3: V-groove+Partition Groove+Smaller V-groove+Path-changing Groove]

FIG. 31 to FIG. 35 demonstrate Embodiment 3 having a substrate with a V-groove 34 followed by a smaller V-groove 35 aligning in the axial direction. A partition groove 36 and a path-changing groove 112 are formed on the substrate perpendicular to the V-grooves 35 and 36. The width Q of the path-changing groove 112 is shorter than the length C of the PD chip (Q<C). But the length L of the path-changing groove 112 is shorter than Embodiment 2. However, the length L of the path-changing groove 112 is still longer than the width B of the PD chip (B<L). When the PD chip 42 is mounted above the path-changing groove 112, both sides of the path-changing groove 112 reveal. The length L of the path-changing groove 112, the width B of the PD 42 and the breadth H of the substrate should satisfy an inequality B<L≦H. Embodiment 2 proposed a long path-changing groove (L=H). Embodiment 3 employs a short path-changing groove (B<L<H). In any cases, a path-changing groove shorter than the width B of the PD (L<B) is forbidden, since the closed path-changing groove suppresses the adhesive from occupying the space just below the PD chip.

Figure 35:
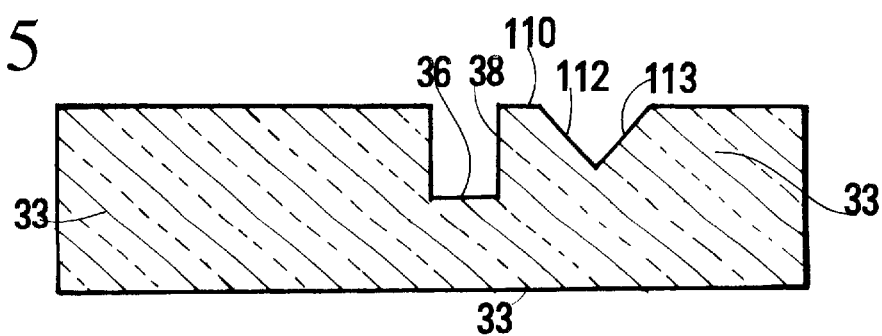
FIG. 35 is a longitudinal vertical section of the substrate of another embodiment having a path-changing groove with a slanting rear surface.
Figure 36:
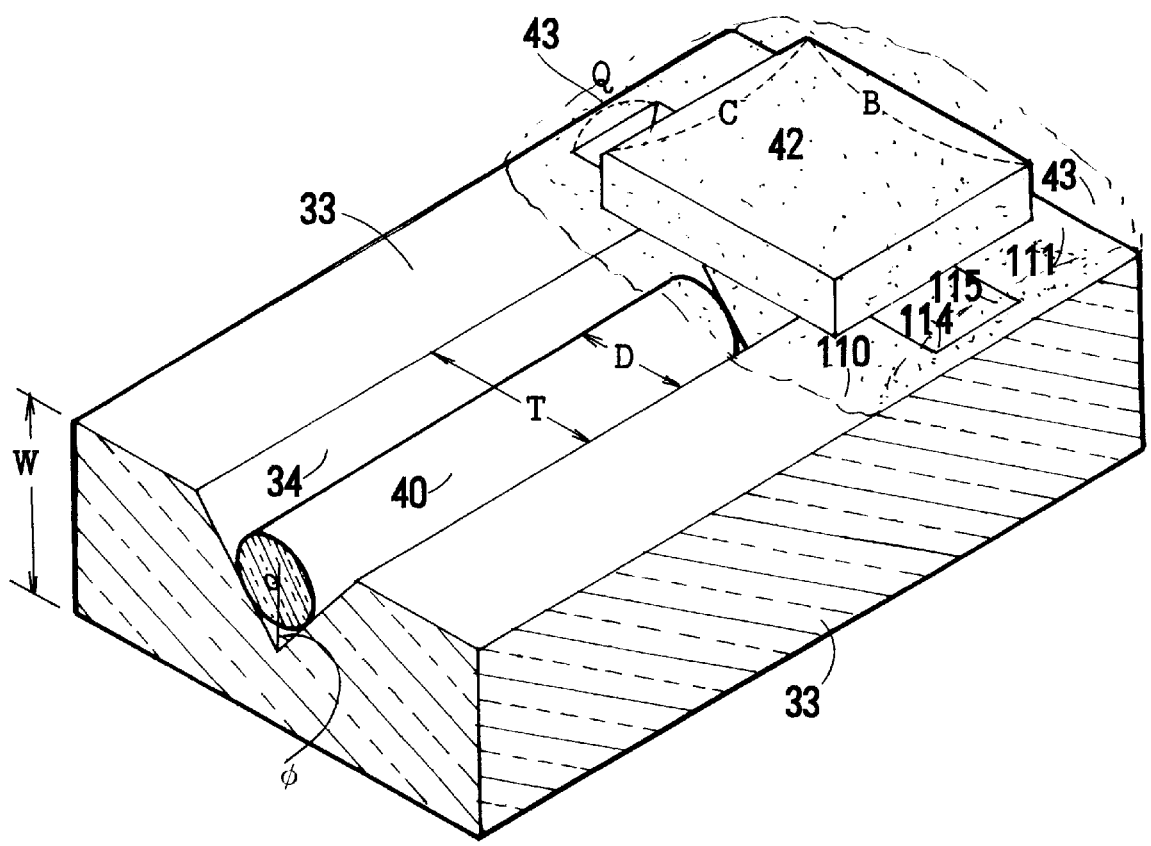
FIG. 36 is a perspective view of a fourth embodiment PD module having a V-groove, a short path-changing groove and a PD without a partition groove.
Figure 37:
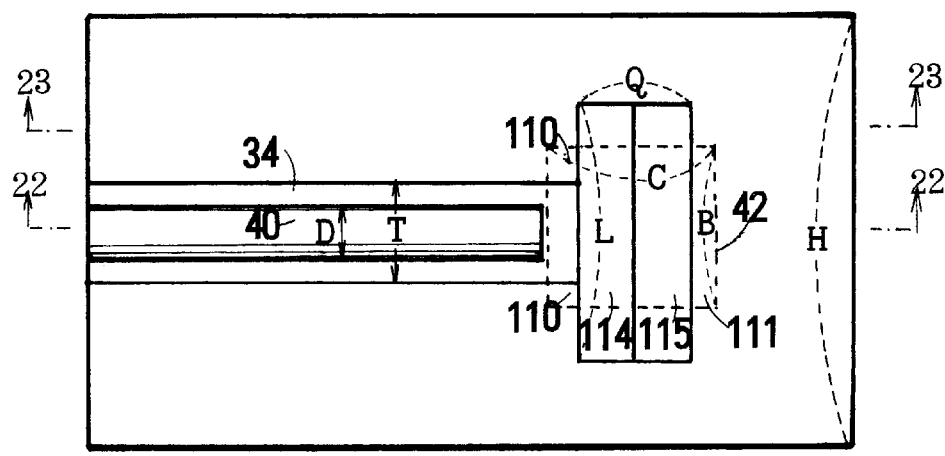
FIG. 37 is a plan view of the same embodiment PD module lacking the partition groove.
Figure 38:
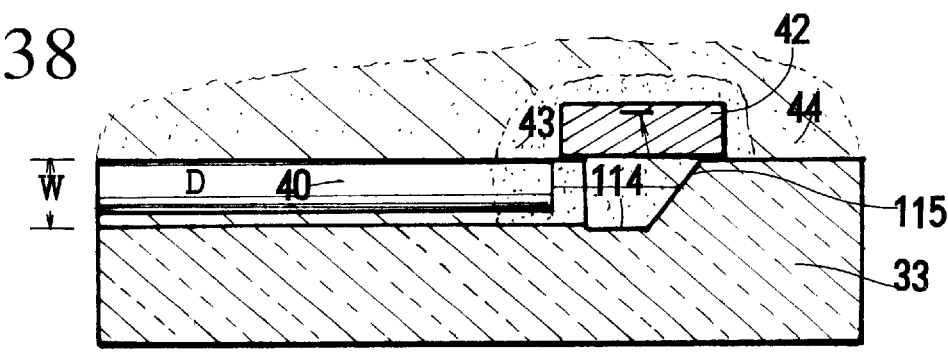
FIG. 38 is a longitudinal vertical section of the embodiment PD module having the fiber, the PD and adhesives, taken along a line 22—22 in FIG. 37.
Figure 39:
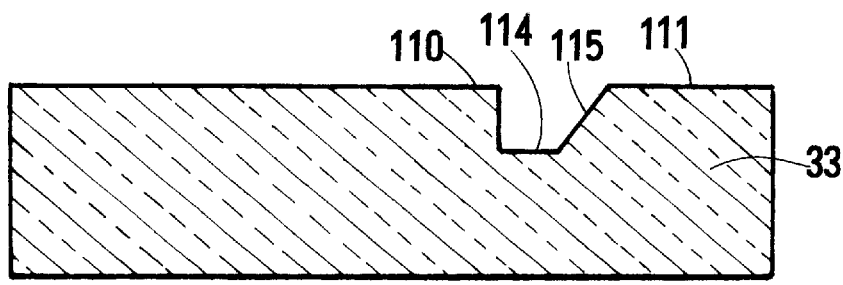
FIG. 39 is a longitudinal vertical section of the substrate of the embodiment PD module taken along a line 23—23 in FIG. 37.

Like Embodiment 2, Embodiment 3 has the longitudinal larger V-groove 34 in the axial direction and the lateral partition groove 36 at the front end of the V-groove 34. The partition groove 36 can be made either by dicing or by etching. A short, smaller V-groove 35 follows the partition groove 36 on the same axial line as the larger V-groove 34. The path-changing groove 112 lies at the front end of the second V-groove 35. The path-changing groove 112 has a shorter length L than the full width H of the substrate 33. Similarly to Embodiment 2, the light emanating from the fiber 40, passes the second V-groove 35 in a transparent adhesive 43, shoots a slanting reflection plane 113 of the path-changing groove 112. Being reflected by the slanting reflecting plane 113, the light goes into the PD 42 via the bottom. The reflection angle is determined by the slanting angle of the plane 113. The path-changing groove 112 of FIG. 31 to FIG. 34 has a section of an asymmetric reverse trapezoid. The path-changing groove 112 can be replaced by a V-groove as shown in FIG. 35. The PD is in contact with two points of a stripe 110 between the partition groove 36 and the path-changing groove 112 and a rear bank 111 of the path-changing groove 112.

Figure 33:
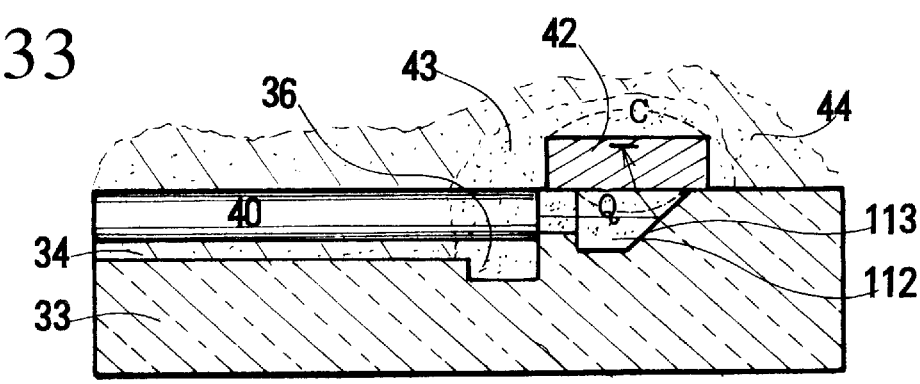
FIG. 33 is a longitudinal vertical section of the same PD module including the PD, the fiber and the adhesives, taken along a line 18—18 in FIG. 32.
Figure 34:
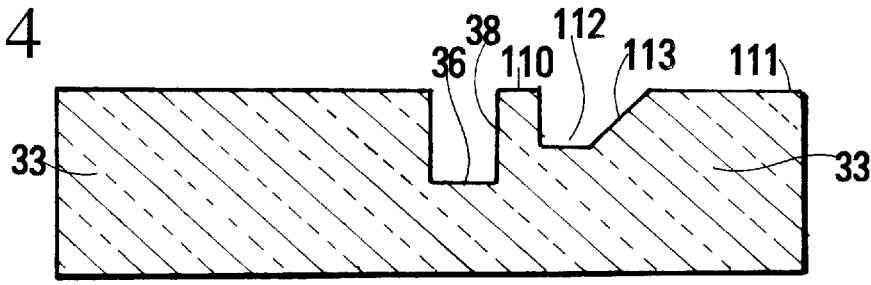
FIG. 34 is a longitudinal vertical section of the substrate of the same embodiment, taken along a line 17—17 in FIG. 32.

As shown in FIG. 33, the transparent adhesive 43 is only potted to the space including the PD 42, the second V-groove 35, the partition groove 36, the path-changing groove 112 and the end of the fiber 40. The path-changing groove 112 aims at pervasion of the transparent resin 43 into the narrow space beneath the PD chip. The partition groove 36 has the roles of guiding the transparent resin 43 into the narrow second V-groove 35 and of positioning the front end of the fiber. Preferably, a metal film or a dielectric film is provided to the slanting reflecting plane 113.

The end of the fiber does not submerge into the narrow space below the PD 42. The end separates from the PD. The separation allows the ridge of the fiber either to project upward from the surface 111 of the substrate 33 (W<(D/2)(1+cosec φ)) or to sink in the V-groove 34 entirely (W>(D/2)(1+cosec ®)). Here, D is the diameter of the fiber, W is a depth of the V-groove and φ is half of the bottom angle of the V-groove.

The partition groove 36 determines the position the fiber in the axial direction at the front wall 38. Like Embodiment 2, the end of the fiber 40 is stuck to the substrate by potting the transparent adhesive 43 to the space including the partition groove 36, the second V-groove 35 and the path-changing groove 112. The transparent adhesive 43 which has a refractive index similar to the fiber fills the region between the fiber 40 and the PD 42 without void. The fiber 40 is fastened by supplying a fixation adhesive 44 to the fiber. The fixation adhesive 44 has the role of protecting the elasticity of the inner transparent adhesive 43 by forming a hard skeleton.

[Embodiment 4: V-groove+Path-changing Groove]

Figure 40:
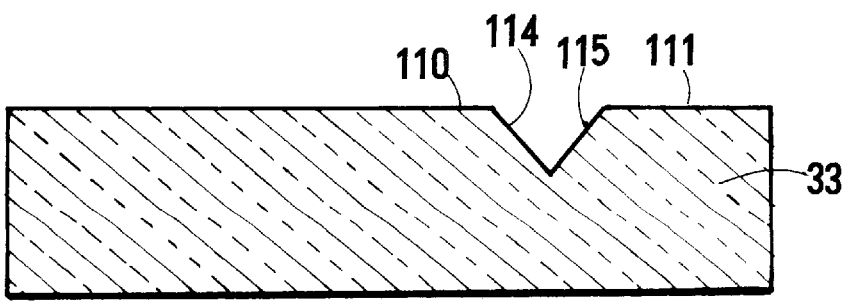
FIG. 40 is a longitudinal vertical section of a substrate of an embodiment similar to FIG. 39.
Figure 41:
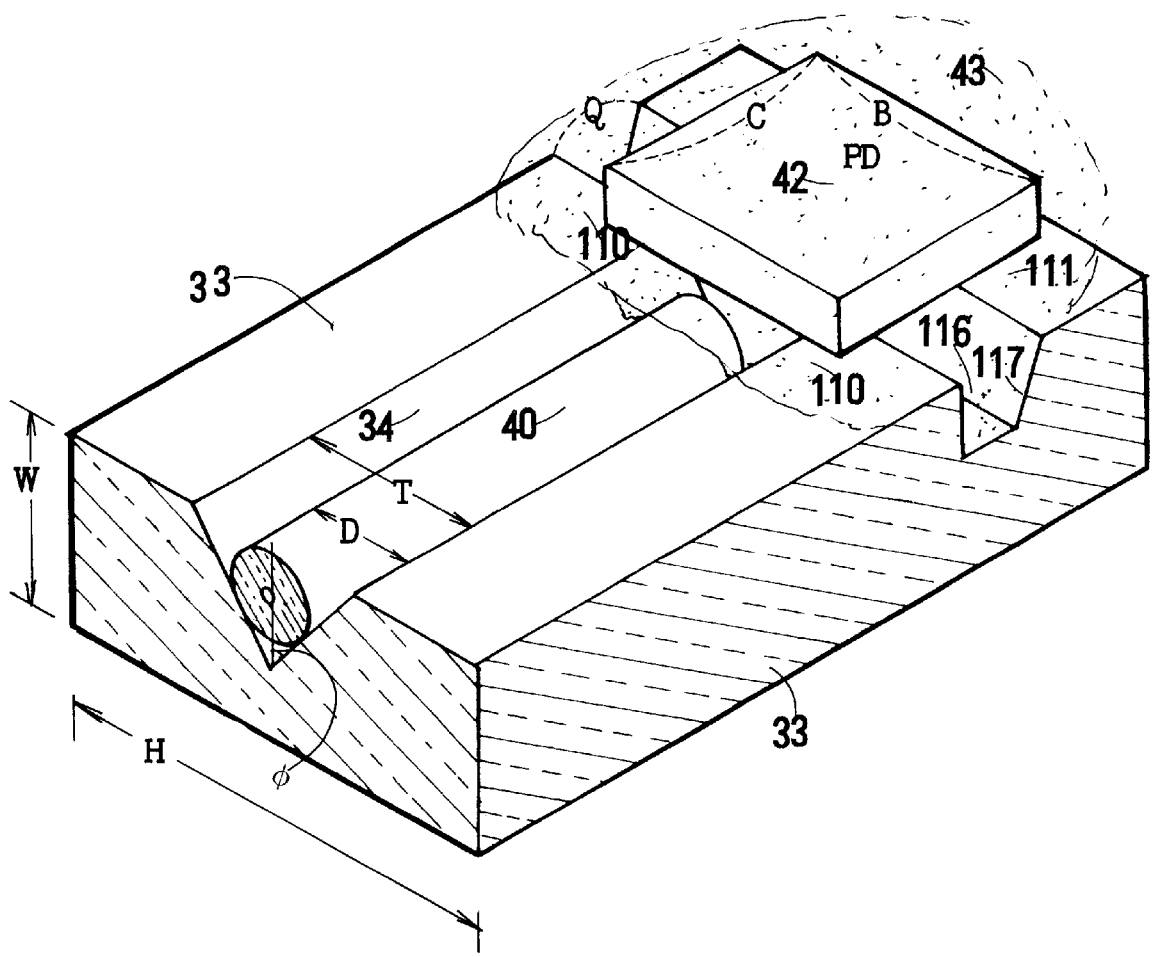
FIG. 41 is a perspective view of a fifth embodiment of a PD module having a V-groove, a long path-changing groove and a PD without a partition groove.
Figure 42:
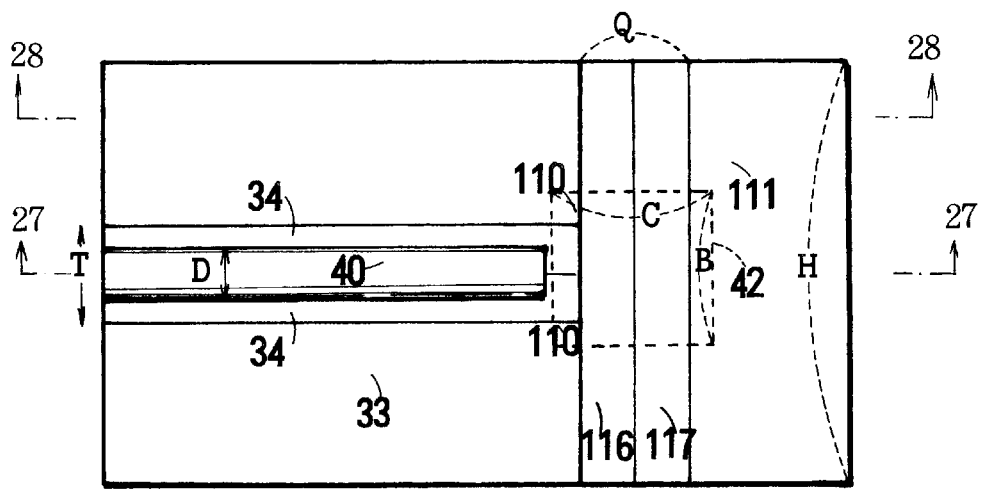
FIG. 42 is a plan view of the same embodiment PD module lacking the partition groove as FIG. 41.
Figure 43:
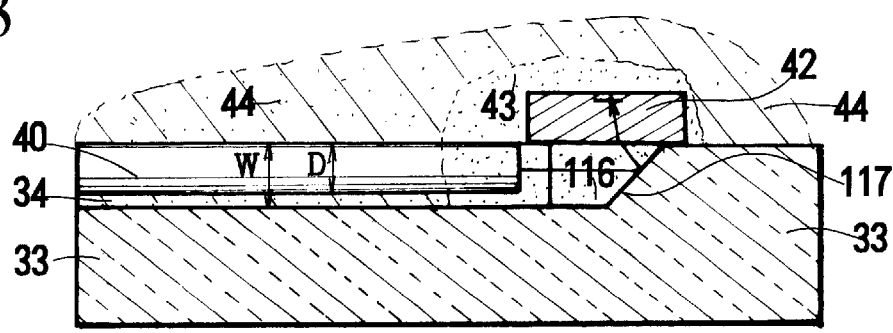
FIG. 43 is a longitudinal vertical section of the embodiment PD module having the fiber, the PD and adhesives taken along a line 27—27 in FIG. 42.
Figure 44:
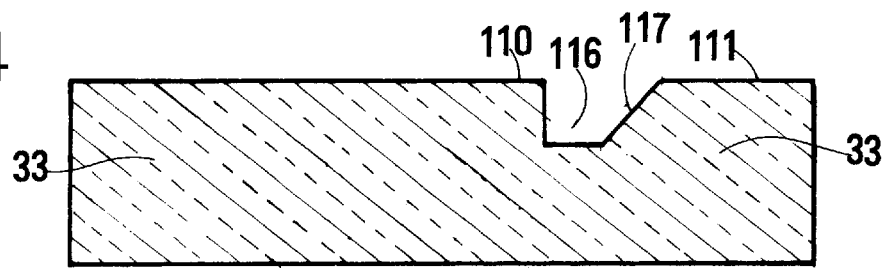
FIG. 44 is a longitudinal vertical section of the substrate of the embodiment PD module taken along a line 28—28 in FIG. 42.
Figure 45:
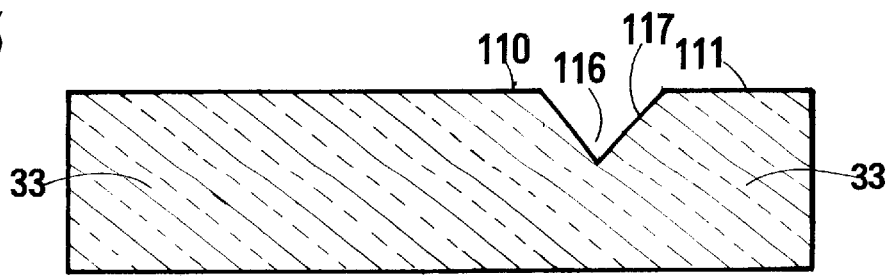
FIG. 45 is a longitudinal vertical section of a substrate of an embodiment similar to FIG. 44.

FIG. 36 to FIG. 40 demonstrate Embodiment 4 which is a simplified example. A silicon substrate 33 has a longitudinal V-groove 34 and a lateral path-changing groove 114 following the V-groove 34 directly. Embodiment 4 lacks the second V-groove and the partition groove. The width Q of the path-changing groove 114 is shorter than the length C of the PD 42. The groove 114 has a slanting reflection plane 115. The PD 42 is first bonded on the metallized pattern of the substrate. The fiber 40 is inserted into the V-groove 34 and glued to the V-groove 34 by a transparent adhesive 43 which is partially supplied to a space having the path-changing groove 114 and a part of the V-groove 34. The path-changing groove 114 helps the adhesive 43 to occupy the whole space under the PD without void. Extending in the lateral direction, the path-changing groove 114 does not traverse the fill width of the substrate (H). The path-changing groove 114 is longer than the width B of the PD 42. The length L of the groove 114 satisfies an inequality of B<L<H. The PD 42 has three bases on the surface, one side and the other side of the V-groove 34 and a rear bank 111 of the path-changing groove 114. A metal film is optionally coated on the slanting reflecting plane 115 and the path-changing groove 114. The slanting reflecting plane 115 and the V-groove 34 can be formed by chemical etching. The vertical rear wall of the path-changing groove 114 can be cut either by a mechanical tool or by an RIE (reactive ion etching). The path-changing groove 114 can be a V-groove as shown in FIG. 40. In the case, the anisotropic etching can make the V-groove 34, the path-changing groove 114 at a stroke.

This embodiment spares the small second V-groove. The front side bases of the PD recede in reverse side directions. The side bases are narrower than the former embodiments. The gap T of the V-groove 34 is given by $T=2W\tan\phi$, where W is the depth of the V-groove 34 and $\phi$ is half of the bottom angle of the V-groove 34. The gap T should be smaller than the PD width B (T<B) for allowing the PD to bridge the side bases 110. An inequality $2W\tan\phi<B$ can always be satisfied by reducing W, because the fiber need not be fully buried in the V-groove 34. A small rate B/D forces the ridge of the fiber 40 to protrude from the V-groove 34.

When the ridge of the fiber is just on a level with the substrate surface, $W=(D/2)(1+\csc\phi)$. The gap T between the side bases is $T=D\tan\phi(1+\csc\phi)$. When the PD width B is larger than the gap T, the PD can bridge the gap. If $B>D\tan\phi(1+\csc\phi)$, the PD can be mounted on the both side bases 110. $\phi=35°$ requires an inequality of B>1.96D for the PD. For D=125 $\mu$m, B should be longer than 245 $\mu$m. Since the PD has generally a side (B, C) of 400 $\mu$m to 500 $\mu$m, the PD has enough margins for bonding.

[Embodiment 5: V groove+Path-changing Groove]

FIG. 41 to FIG. 45 denote Embodiment 5 which lacks the partition groove and the second V-groove. A longitudinal V-groove 34 is cut on a substrate 33. A path-changing groove 116 is formed in the lateral direction. The V-groove 34 meets at right angles with the path-changing groove 116. The front of the path-changing groove 116 is a slanting reflecting plane 117. In the embodiment, the path-changing groove 116 is as long as the width of the substrate H (L=H). The equality L=H facilitates a machine tool to dig the path-changing groove 116. Embodiment 5 (L=H) differs from Embodiment 4 (L<H) only in the length L of the groove 116. Other sizes and features are similar to Embodiment 4.

A PD 42 is supported on three bases 110 and 111 of the substrate. An optical fiber 40 is laid in the V-groove 34 of the substrate 33 having the PD 42. A transparent adhesive 43 is supplied to the fiber end, the path-changing groove 116 and the PD 42. The long path-changing groove 116 enhances the fluidity of the transparent resin 43 for pervading the space beneath the PD 42 without making bubbles. The path-changing groove 116 and the slanting plane 117 preferably should be coated with a metal film. The slanting reflecting plane 117 and the V-groove 34 can be made by etching. The rear wall of the path-changing groove 116 can be cut vertically by a machine. The RIE can also produce the rear wall of the path-changing groove 116. The section of the groove 116 is a reverse trapezoid. The section of the path-changing groove 116 can be replaced by a simple V-groove. In the case, the anisotropic etching can produce the V-groove 34 and the path-changing groove 116 at a stretch.

Figure 46:
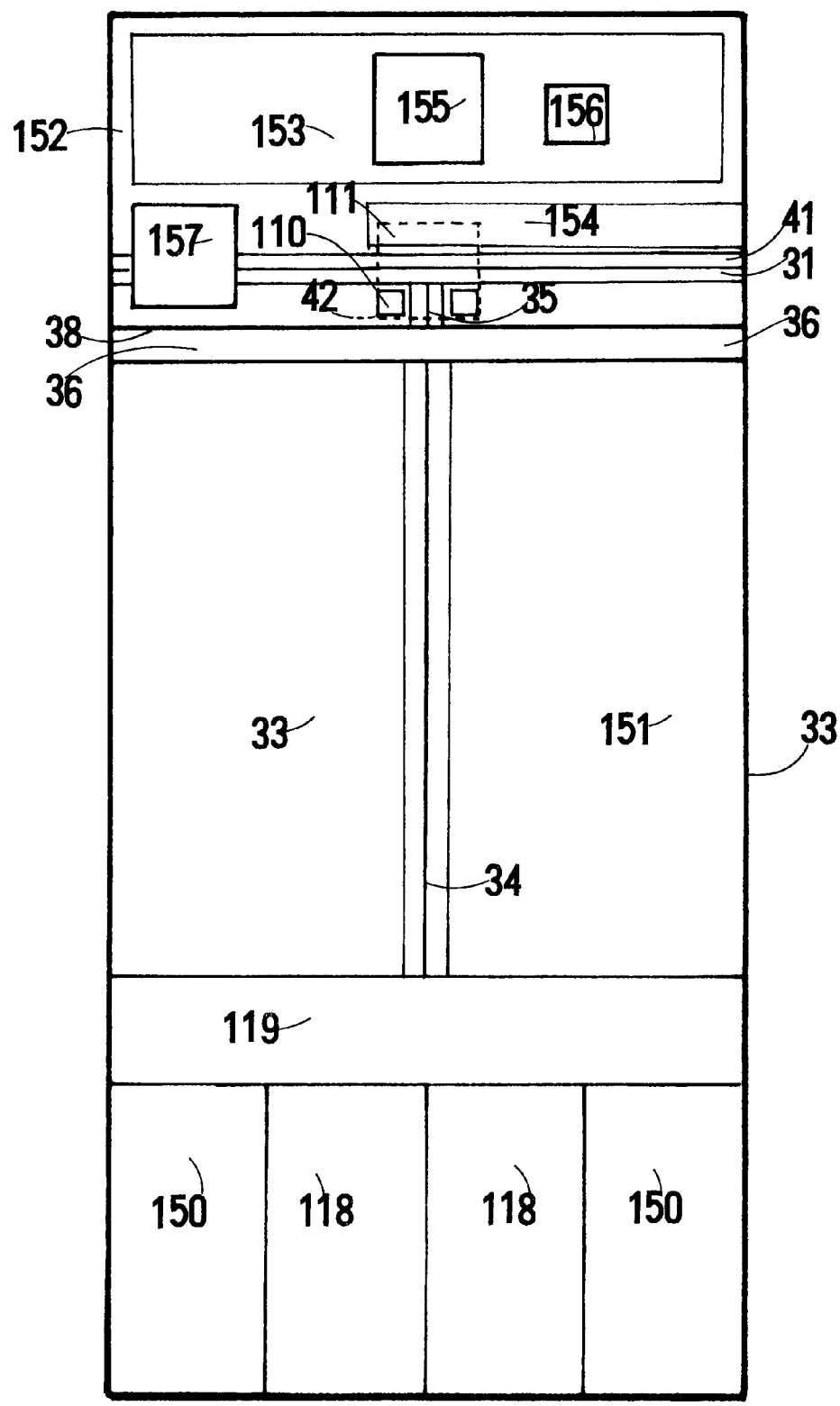
FIG. 46 is a plan view of a Si substrate of the second embodiment PD module having longitudinal V-grooves, a partition groove, a path-changing groove, metallized patterns and devices.

A fixation adhesive 44 is further supplied onto the fiber 40 and the transparent resin 43. FIG. 46 is a plan view of the whole Si substrate 33 corresponding to Embodiment 2. A long V-groove 34 is dug along a central line in the middle of the substrate 33 for sustaining an optical fiber (cladding+core). A bigger V-groove 118 is formed before the V-groove 34 along a common central line for holding a ferrule attached on the fiber. The cladding has a diameter of 125 $\mu$m. The ferrule having a larger diameter than the cladding requires the big groove 118. Both banks of the big V-groove 118 are lower steps 150. A slope 119 joins the lower steps 150 to a middle region 151. The slope 119 is produced by the same anisotropic etching as that for making the V-groove 118, the V-groove 34 and a smaller V-groove 35. The middle region 151 has only the central longitudinal V-groove 34.

A rear region 152 follows the middle region 151. The rear region 152 and the middle region 151 are separated by a partition groove 36 formed in the lateral direction. A small second V-groove 35 and a path-changing groove 31 are formed on the rear region 152. Metallized wiring patterns 153 and 154 are formed on the rear region 152 by printing or vacuum evaporation. A PD 42 will be mounted on three metallized bases which are separated by the second V-groove 35 and the path-changing groove 31. The rear region 152 will be furnished with an amplifier IC 155, a capacitor 156 and other electronics devices in addition to the PD 42. The metallized patterns are replenished for the sake of attaching the devices. The metallized patters are insulated from the Si substrate, since the Si substrate is fully coated with a silicon oxide film ($SiO_2$) and the metallized patterns are formed on the $SiO_2$ film.

FIG. 47 is a perspective view of the Si substrate equipped with the PD, the AMP, the capacitances, a fiber and a ferrule at the predetermined positions. The PD 42 is soldered at an end of the pattern 154 which is just above the path-changing groove 31 and on an extension of the V-groove 34. The preamplifier IC (AMP) 155 is bonded on another metallized pattern 153 before the PD 42. The planar capacitors (di-cap) 156 and 158 are bonded on the pattern 153 for reducing noise by decreasing the source impedance. The PD 42, bottom-incidence type, has an annular n-electrode (cathode) on the bottom which is directly bonded on the metallized pattern 154. A top p-electrode of the PD is connected to an input pad of the preamplifier 155 by a wire 161. An output pad of the AMP 155 is joined to a metallized pattern 159 by a wire 163. The metallized pattern 153 serves the earth level to the AMP 155. The AMP 155 endows the PD module with high resistance against the external noise by amplifying the weak signal current of the PD in the same package.

The electronic devices are all soldered at a stroke in a solder reflow-furnace on the determined metallized patterns of the substrate. The devices and the patterns are connected by wirebonding. Then, a ferrule 165 holding an optical fiber 40 is inserted into the big V-groove 118. The fiber 40 is laid in the V-groove 34. The fiber end is stopped by the front wall 38 of the partition groove 36. The temporary structure is shown in FIG. 47. Two kind of resins are used as adhesives. First, a transparent adhesive 43 is potted to a restricted space including the fiber end, the partition groove 36, the second small V-groove 35, the path-changing groove 31 and the PD 42. The existence of the long path-changing groove 31 enhances the fluidity of the transparent resin and facilitates the adhesive 43 to pervade in the space between the fiber and the PD without bubbles. Second, a fixation adhesive 44 is painted on the fiber 40, the ferrule 165 and the transparent resin 43. When the fixation adhesive 44 is dried and hardened, the ferrule 165 and the fiber 40 are tightly stuck to the substrate 33.

FIG. 48(1) to FIG. 48(5) are partial views of some parts of the module shown in FIG. 47. FIG. 48(1) is a plan view of the bases for mounting the PD chip 42 denoted by dotted lines. The path-changing groove 31 and the slanting reflecting plane 41 are lined with a metal film in order to heighten the reflection power. The metallized pattern 154 extending from the right side of the substrate 33 is divided into three parts by the path-changing groove 31 in the vicinity of the second V-groove 35. The three parts have electrode pads 166 (e.g., Au—Sn) formed on the pattern 154 by vacuum-evaporation or electro-plating. Two smaller pads are made on the stripe bases 110 held by the second V-groove 35 and the path-changing groove 31. A larger pad 166 is made on the rear bank base 111. The bottom n-electrode of the PD is glued to the three pads.

Four adjustment marks 167, 168, 169 and 170 are printed outside of the PD base pads for adjusting the position of the PD 42. The PD 42 is laid on a determined spot by observing the four marks and coinciding the four corners of the PD 42 with the marks. The PD stably lies on the three bases on the stripe 110 and the rear bank 111, bridging the V-groove 35 and the path-changing groove 31.

FIG. 48(2) shows the fiber end adjoining to the partition groove 36 and the second V-groove 35. The light emanating from the fiber 40 passes the V-groove 35 and shoots the slanting reflection plane 41. The slanting plane 41 reflects the light upward and guides the light into the PD 42 via the bottom. FIG. 48(3) shows the rays emitted from the fiber. The rays are reflected on the plane 41, introduced into the PD, and detected at the pn-junction near the top of the PD. FIG. 48 (4) is a section of the V-groove 34 having the fiber 40 for denoting the definitions of the depth W, the gap T and the half of bottom angle $\phi$. FIG. 48 (5) is a section of the path-changing groove 31. A round denotes the spot of rays.

Figure 49:
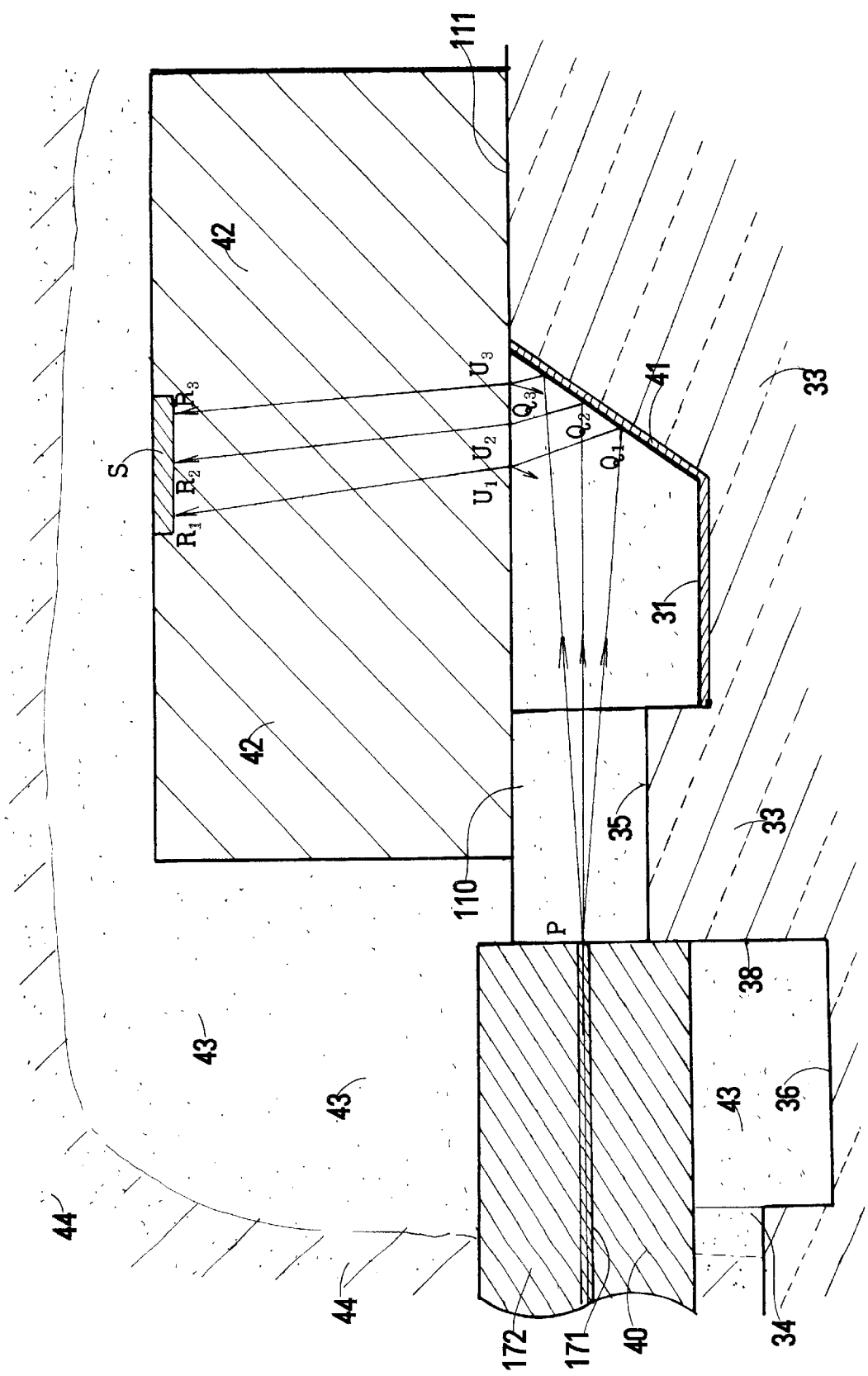
FIG. 49 is an enlarged lateral section of the path-changing part for showing the rays emanating from the fiber end and going into the PD via a bottom.

FIG. 49 is an enlarged section in the vicinity of the partition groove 36, the second V-groove 35, the path-changing groove 31 and the PD 42. The fiber 40 consists of a core 171 and a cladding 172. The path-changing groove 31 and the slanting reflection plane 41 is lined with a metal film for improving the reflection rate. Adjoining the front end of fiber to the front wall 38 of the partition groove 36 determines the axial position of the fiber. The second V-groove 35 has a 71° bottom angle ($\phi=35°$). The light emanating from the fiber 40 disperses in an aperture angle $\theta$ which is given by $\cos\theta = n_1/n_0$, where $n_1$ is a refractive index of the cladding and $n_0$ is a refractive index of the core. Dispersing rays are denoted by $PQ_1$, $PQ_2$ and $PQ_3$.

The slanting reflection plane 41 reflects the rays upward to $Q_1U_1$, $Q_2U_2$ and $Q_3U_3$ The rays go into the PD 42. Since the PD 42 has a refractive index larger than the transparent resin 43, the rays are refracted and reflected at the interface. Refracted rays $U_1R_1$, $U_2R_2$ and $U_3R_3$ reach the sensing region S including the pn-junction. The rays are converted into photocurrent.

The slanting angle of the reflection plane 41 is not 45 degrees but 54 degrees. The reflected rays $Q_1U_1$, $Q_2U_2$ and $Q_3U_3$ are not rectangular to the PD bottom. The rays are partially reflected at the bottom. The reflected rays cannot return along the same paths to the fiber, since the reflected angle is not 90 degrees at $U_1$, $U_2$ and $U_3$. If the reflected rays returned to the fiber and the LD as a signal light source, the returning light would instabilize the LD operation by perturbing the gain of a resonator of the LD. This invention is immune from the LD instability induced by the returning light due to the slanting angle different from 45 degrees. This is one of the advantages of the present invention. Conventional metal package type PD modules are used to cut the end of the fiber slantingly, for example, at eight degrees for avoiding the return of the light to the LD. This invention dispenses with the oblique fiber end. FIG. 49 shows a non-slanting end of the fiber.

The transparent resin 43 has a refractive index nearly equal to the refractive index of the fiber. No reflection occurs at the end P of the fiber.

When near-infrared light (1.55 $\mu$m or 1.3 $\mu$m) is employed as a carrier of light signals, the PD should be an InGaAs type or an InGaAsP type which is produced by growing an InGaAs light receiving layer or an InGaAsP light receiving layer on an InP substrate, diffusing Zn through a mask for making a p-region and forming a pn-junction. Si-PD or Si-APD is sometimes available for the signal light of other wavelengths.

When the devices have mounted on the substrate as shown in FIG. 47, the device-loaded substrate is laid upon a leadframe which is made by punching a thin metal plate. The patterns on the substrate are connected by wires to corresponding leads. The leadframe-carrying substrate is encapsulated by inserting the substrate into a mold, supplying a fluid resin into the mold, and hardening the resin in the mold by cooling or heating. Then, the leads extending outward are cut away. The molded resin has the role of a package. Thus, a PD module in a plastic mold package is produced. The plastic mold package device is inexpensive. Prior cylindrical PD modules have employed metal packages for hermetic-sealing the cylindrical structure. The metal packages raised the cost of the prior PD modules. This invention can alleviate the cost by employing cheap plastic mold packages. Plastic mold package is another advantage of the present invention. The figures of the PD module of the second embodiment in a plastic mold package are now omitted, since the figures are quite similar to the former example shown in FIGS. 20, 21, 22 and 23.

[Embodiment of Three-fiber Type PD Module]

Figure 50:
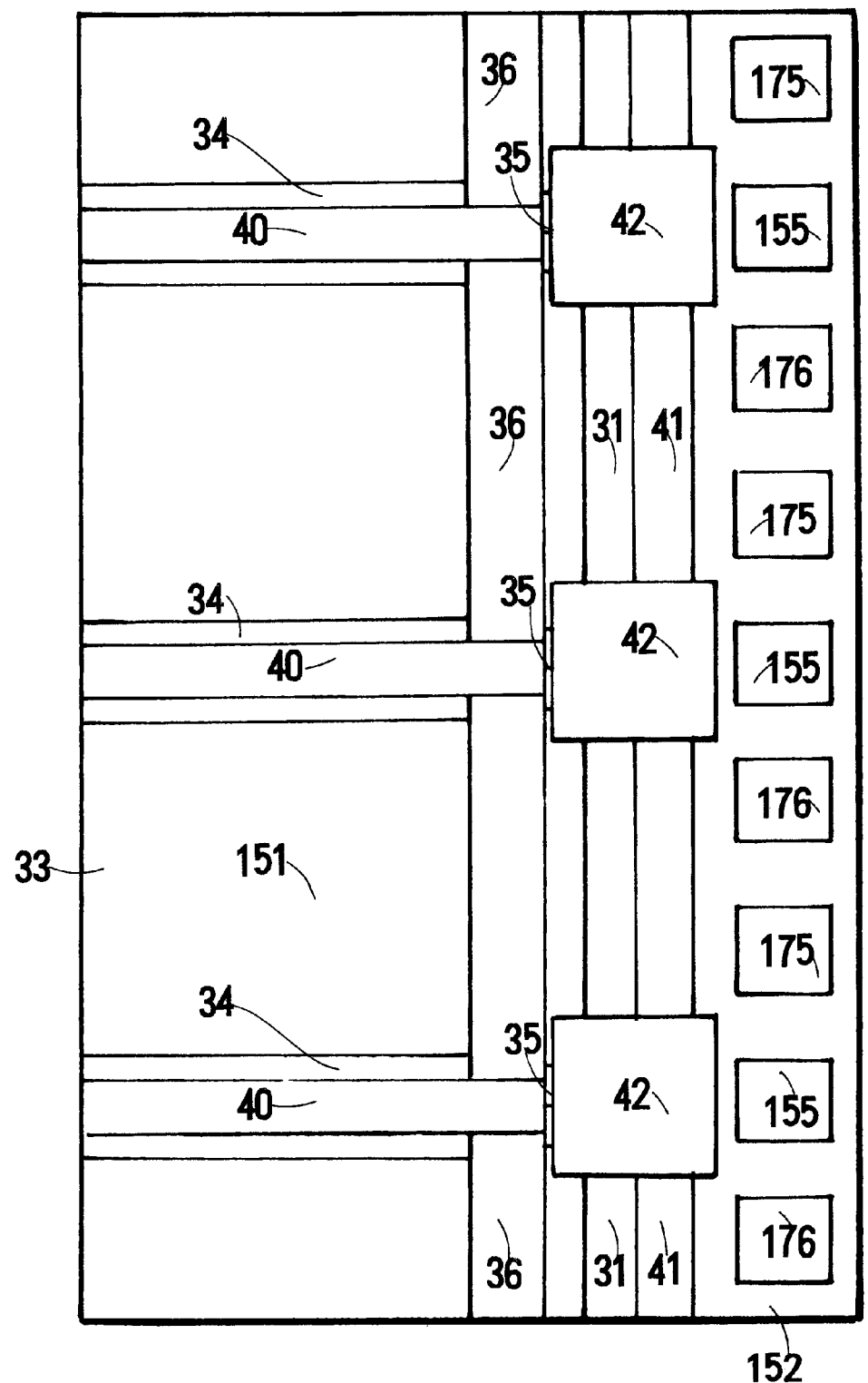
FIG. 50 is a plan view of a three-fiber type PD module, which is an application of the second embodiment PD module.

In addition to a single PD module, this invention can easily be applied to multi-PD modules. FIG. 50 is a plan view of a three PD type embodiment which has three PDs, three fibers and three V-grooves on a single substrate. A Si substrate 33 has a lateral side longer than a longitudinal side. A common long partition groove 36 is dug in the lateral direction in the middle of the Si substrate 33. Three parallel first V-grooves 34 are formed from an end of the substrate 33 to the partition groove 36. The V-grooves 34 meet at right angles to the partition groove 36. Smaller second V-grooves 35 follow the common partition groove 36 on extensions of the first V-grooves 34. A common long path-changing groove 31 is formed in the lateral direction. The path-changing groove 31 adjoins the second V-grooves 35. The front wall of the path-changing groove 31 is a slanting reflection plane 41 for changing the light path upward. The V-grooves 34 and 35 can also be fabricated by the anisotropic etching like the former embodiments. The partition groove 36 can be made by a dicing saw or other machine tools. The partition groove 36 can otherwise made by the RIE (reactive ion etching) which has excellent directivity. Of course, the V-grooves 34 and 35 can be made by the mechanical tools.

Three PD chips 42 are attached on the substrate above the path-changing groove 31. Each PD 42 is sustained by three bases like the former examples. The PD 42 spans the second V-groove 35 and the path-changing groove 31. Amplifier ICs 155 and other electronic devices 175 and 176 are furnished in the vicinity of the PDs 42 on the rear bank 152 of the substrate. Optical fibers 40 are imbedded in the V-grooves 34. Each light path from the fiber to the PD is filled with a transparent resin having a refractive index nearly equal to the fiber. The partition groove 36 and the path-changing groove 31 are effective for the transparent adhesive to pervade in the space under the PD without void. The fiber 40 is glued to the V-groove 34 with a fixation adhesive. The embodiment can treat three different signals carried by the three fibers. This invention can be applied to a multi-PD module having any number of PDs. The fibers do not project from the front side in the example. The front side is flat. This module is designed for being coupled to a tape fiber having three fibers at the front side. Of course, the non-projecting fibers can be replaced by projecting ferrules like FIG. 20. The style of the fiber or ferrule should be determined for being coupled to a partner connector. In practice, the substrate shown in FIG. 50 will be encapsulated by a plastic molding package like FIG. 20. The plastic package reduces the cost far lower than the metal package or the ceramic package.

[Embodiment of Five-fiber Type PD Module]

Figure 51:
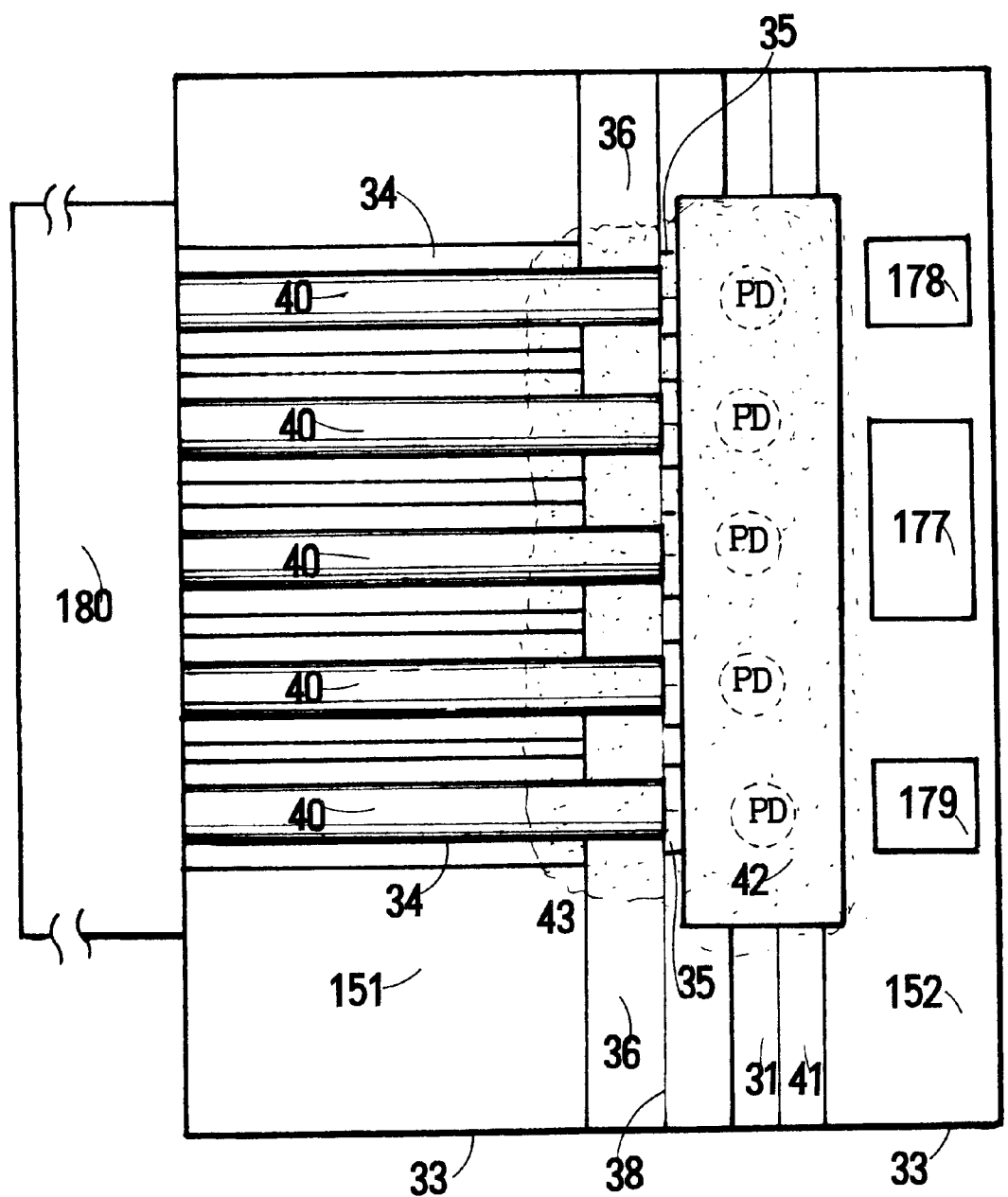
FIG. 51 is a plan view of a five-fiber type PD module, which is an application of the second embodiment PD module.

A multi-PD type module having separated PDs has been described. Here, another multi-PD module having an array of PDs is explained. FIG. 51 is a plan view of a five PD type. A silicon (100) substrate 33 has a lateral side and a longitudinal side. The lateral side is longer than the longitudinal side. A common long partition groove 36 and a common long path-changing groove 31 are parallelly formed in the lateral direction on the Si substrate 33. Five first V-grooves 34 are formed in parallel in the longitudinal direction on the bank 151 from the front end of the substrate to the partition groove 36. Five smaller V-grooves 35 are formed between the partition groove 36 and the path-changing groove 31 in the longitudinal direction. The axes of the second V-grooves 35 are common with the axes of the first V-grooves 34. The front wall of the path-changing groove 31 is assigned to be a slanting reflecting (111) plane 41.

An array including five PDs 42 is laid upon the bases of the substrate above the path-changing groove 31. Instead of individual PDs, the five PD array is adopted here. The use of the array saves the time of alignment of the PDs on the substrate. Behind the PD array, electronic devices 177, 178 and 179 are equipped on the rear bank 152. FIG. 51 shows only the substrate having the fibers and the PD array. In practice, the substrate is stuck to a leadframe and the whole of the substrate and the leadframe are molded in a plastic package. The module has a flat front end. A five-fiber tape connector 180 will be attached to the front end of the embodiment PD module. In addition to three PD type or five PD type, PD modules having eight PDs, ten PDs or other arbitrary number of PDs can be fabricated according to the teaching of the present invention.

[Embodiment (Long Partition Groove, Short Path-changing Groove)]

Figure 54:
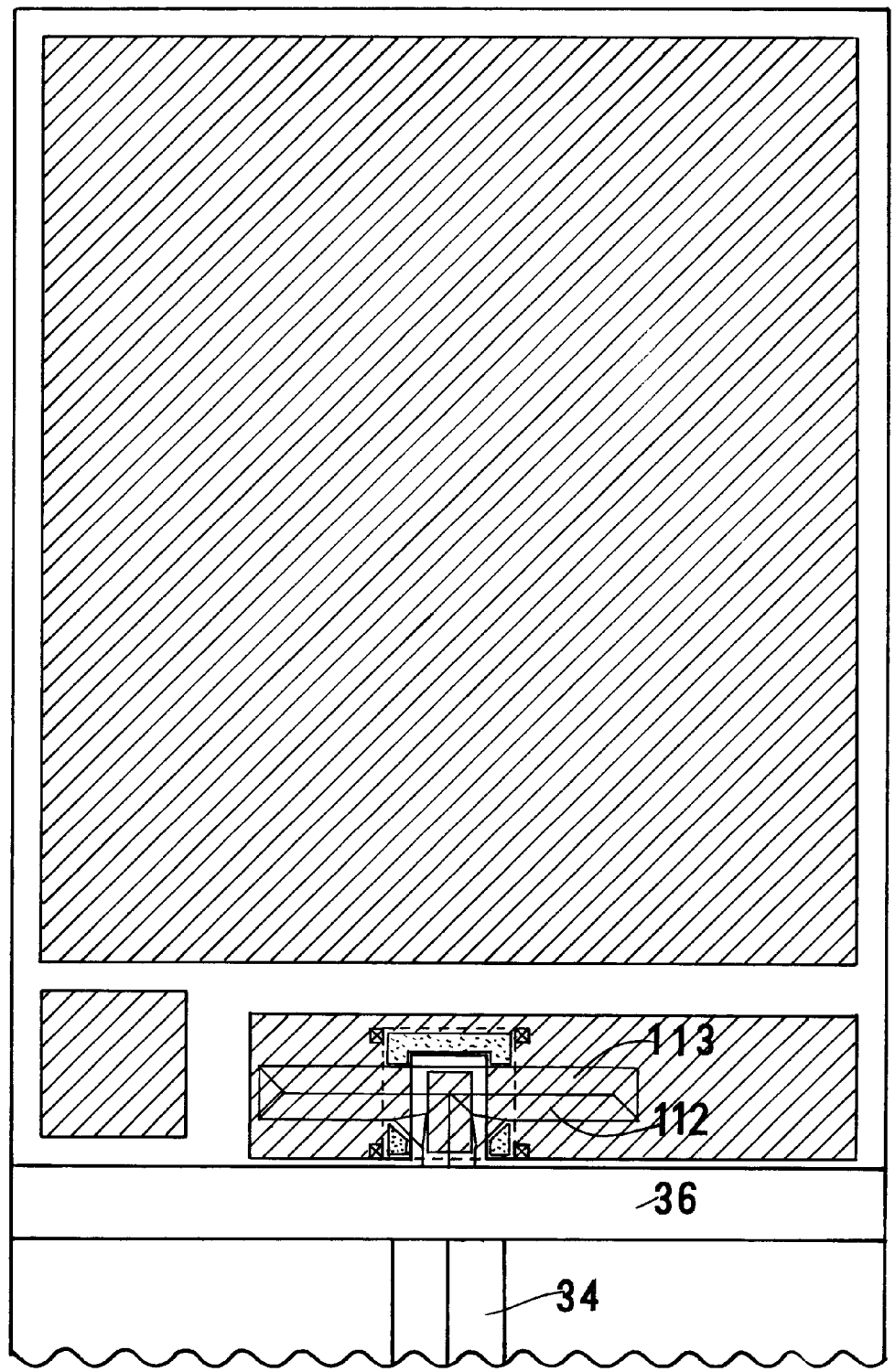
FIG. 54 is an enlarged plan view of the part of the bases of the PD chip.

FIG. 52 is a plan view of a substrate 33 of another embodiment having a long partition groove 36 and a short path-changing groove 112. The size is 9.1 mm×3 mm×1 mm. FIG. 53 is a section of the same substrate 33. FIG. 54 is an enlarged plan of the part of the bases for the PD. In FIG. 54, hatched parts mean metallized patterns. Dotted parts mean the film of solder for fixing the PD. The explanation is omitted, since similar PD modules have been explained in preceding chapters.

What is claimed is:

1. A PD module comprising:

a substrate;

a first V-groove formed in the longitudinal direction on the substrate;

a partition groove with a front wall and a rear wall formed in the lateral direction vertically to the first V-groove on the substrate for alignment and for facilitating an adhesive to pervade, the partition groove being deeper than the first V-groove;

an optical fiber with a front end fixed in the first V-groove for guiding signal light, the front end of the fiber being in contact with the partition groove;

a second V-groove with an end formed beyond the partition groove at an extension of the first V-groove on the substrate, the second V-groove being shallower than the first V-groove;

a slanting reflection plane formed at the end of the second V-groove for reflecting the light from the fiber;

a PD chip with a top and a bottom lying on the substrate above the second V-groove and the slanting reflection plane.

2. A PD module as claimed in claim 1, further comprising a transparent adhesive with a refractive index similar to the fiber being supplied to a space including the end of the fiber, the partition groove and the bottom of the PD chip, and a fixation adhesive supplied on the first V-groove and on the transparent adhesive for fixing the fiber to the first V-groove, the light emanating from the fiber being reflected by the slanting reflecting plane and being introduced into the PD chip.

3. A PD module as claimed in claim 2, wherein the substrate is a (100) silicon single crystal substrate and the first V-groove, the second V-groove and the slanting reflecting plane are made on the (100) silicon substrate by anisotropic etching which is faster in {100} planes than in {111} planes.

4. A PD module as claimed in claim 3, wherein the partition groove is made on the silicon substrate by dicing with a mechanical tool.

5. A PD module as claimed in claim 3, wherein the partition groove is made on the silicon substrate by etching.

6. A PD module as claimed in claim 3, wherein the PD chip is a bottom-incidence type PD.

7. A PD module as claimed in claim 6, wherein the slanting reflecting plane is coated with a metal film or a dielectric film for enhancing reflection.

8. A PD module as claimed in claim 7, wherein electronic devices for amplifying electric signal from the PD are mounted upon the substrate.

9. A PD module as claimed in claim 8, wherein the partition groove facilitates the transparent adhesive to occupy the space including the partition groove, the second V-groove and the slanting reflecting plane between the fiber end and the PD chip without void.

10. A PD module as claimed in claim 9, wherein the substrate with the fiber, the PD chips and the devices are enclosed and sealed by a plastic molding package.

11. A PD module as claimed in claim 10, wherein the optical fiber is a quartz single mode fiber and the PD chip is a bottom-incidence type PD having an InGaAs light receiving layer or an InGaAsP light receiving layer.

12. A PD module as claimed in claim 11, wherein the PD chip lies on three sides of the substrate above the second V-groove and the slanting reflection plane.

13. A PD module as claimed in claim 12, wherein the fiber is replaced by an assembly of a plurality of fibers arranged in parallel with an interval, the first V-groove is replaced by an assembly of a plurality of first V-grooves formed on the substrate in parallel with the same interval of the fibers, the second V-groove is replaced by an assembly of second V-grooves formed in parallel following the first V-grooves, the partition groove is a common single -groove perpendicular to the first V-grooves and the second V-grooves, the second V-grooves have slanting reflection planes at ends, a plurality of PD chips are mounted on the substrate above the slanting reflecting planes.

14. A PD module as claimed in claim 13, wherein the PD chips are assembled in a PD array.

15. A PD module comprising:

a substrate;

a first V-groove formed in the longitudinal direction on the substrate;

a path-changing groove with a length L and a width Q having a front wall and a rear wall formed in the lateral direction vertically to the first V-groove on the substrate for ensuring a space at an extension of the first V-groove;

an optical fiber with a front end fixed in the first V-groove for guiding signal light;

a slanting reflection plane formed at the front wall of the path-changing groove for reflecting the light emanating from the fiber;

a PD chip with a width B and a length C mounted on the substrate in front of and at the back of the path-changing groove, the PD lying above the path-changing groove and the slanting reflection plane, the width Q of the path-changing groove being shorter than the length C of the PD chip (Q<C), the length L of the path-changing groove being longer than the width B of the PD chip (B<L).

16. A PD module as claimed in claim 15, further comprising a transparent adhesive with a refractive index similar to the fiber being supplied to a space including the end of the fiber, the path-changing groove and the bottom of the PD chip, and a fixation adhesive supplied on the V-groove and on the transparent adhesive for fixing the fiber to the first V-groove, the light emanating from the fiber being reflected by the slanting reflecting plane and being introduced into the PD chip.

17. A PD module as claimed in claim 16, wherein a partition groove is formed in parallel with the path-changing groove between the path-changing groove and the first V-groove for alignment of the fiber and for facilitating the transparent adhesive to pervade and a second smaller V-groove than the first V-groove is formed at an extension of the first V-groove between the partition groove and the path-changing groove.

18. A PD module as claimed in claim 17, wherein the substrate is a (100) silicon single crystal substrate and the first V-groove, the second V-groove and the slanting reflecting plane are made on the (100) silicon substrate by anisotropic etching which is faster in {100} planes than in {111} planes.

19. A PD module as claimed in claim 18, wherein the partition groove and the path-changing groove are made on the silicon substrate by dicing with a mechanical tool.

20. A PD module as claimed in claim 18, wherein the partition groove and the path-changing groove are made on the silicon substrate by etching.

21. A PD module as claimed in claim 18, wherein the PD chip is a bottom-incidence type PD.

22. A PD module as claimed in claim 21, wherein the slanting reflecting plane is coated with a metal film or a dielectric film for enhancing reflection.

23. A PD module as claimed in claim 22, wherein electronic devices for amplifying electric signal from the PD are mounted upon the substrate.

24. A PD module as claimed in claim 22, wherein the partition groove facilitates the transparent adhesive to occupy the space including the path-changing groove, the partition groove, the second V-groove and the slanting reflecting plane between the fiber end and the PD chip without void.

25. A PD module as claimed in claim 24, wherein the substrate with the fiber, the PD chips and the devices are enclosed and sealed by a plastic molding package.

26. A PD module as claimed in claim 25, wherein the optical fiber is a quartz single mode fiber and the PD chip is a bottom-incidence type PD having an InGaAs light receiving layer or an InGaAsP light receiving layer.

27. A PD module as claimed in claim 26, wherein the PD chip is mounted on three spots of the substrate in front of and at the back of the path-changing groove.

28. A PD module as claimed in claim 27, wherein the front end of the fiber is spatially separated from the PD.

29. A PD module as claimed in claim 28, wherein the fiber is replaced by an assembly of a plurality of fibers arranged in parallel with an interval, the first V-groove is replaced by an assembly of a plurality of first V-grooves formed on the substrate in parallel with the same interval as the fibers, the second V-groove is replaced by an assembly of second V-grooves formed in parallel following the first V-grooves, the partition groove is a common single groove perpendicular to the V-grooves, the path-changing groove is a common single groove perpendicular to the V-grooves and a plurality of PD chips are mounted on three spots of the substrate at extensions of the fibers above the slanting reflection plane of the path-changing groove.

30. A PD module as claimed in claim 29, wherein the PD chips are assembled in a PD array.

* * * * *